(12) United States Patent
Mukaibara

(10) Patent No.: US 8,063,480 B2
(45) Date of Patent: Nov. 22, 2011

(54) PRINTED BOARD AND SEMICONDUCTOR INTEGRATED CIRCUIT

(75) Inventor: Takuya Mukaibara, Susono (JP)

(73) Assignee: Canon Kabushiki Kaisha, Tokyo (JP)

( * ) Notice: Subject to any disclaimer, the term of this patent is extended or adjusted under 35 U.S.C. 154(b) by 506 days.

(21) Appl. No.: 11/674,345

(22) Filed: Feb. 13, 2007

(65) Prior Publication Data

US 2007/0200218 A1  Aug. 30, 2007

(30) Foreign Application Priority Data

Feb. 28, 2006  (JP) .................................. 2006-053802

(51) Int. Cl.
*H01L 23/52* (2006.01)

(52) U.S. Cl. ........ 257/691; 257/692; 257/693; 257/690; 257/734; 257/786; 257/728; 257/531; 257/E21.459; 257/E21.008

(58) Field of Classification Search .................. 257/691, 257/692, 693, 690, 734, 786, 728, 531 E21.459, 257/E21.008

See application file for complete search history.

(56) References Cited

U.S. PATENT DOCUMENTS

| | | | | |
|---|---|---|---|---|
| 5,068,631 | A | 11/1991 | Vince | 333/181 |
| 5,708,372 | A | 1/1998 | Igarashi et al. | 326/27 |
| 5,847,451 | A | 12/1998 | Ohtaki et al. | 257/697 |
| 6,515,868 | B1 * | 2/2003 | Takahashi et al. | 361/760 |
| 6,700,790 | B2 | 3/2004 | Tanaka et al. | 361/748 |
| 2003/0080353 | A1 * | 5/2003 | Suwa et al. | 257/200 |
| 2005/0029648 | A1 * | 2/2005 | Suwa et al. | 257/690 |

FOREIGN PATENT DOCUMENTS

| | | |
|---|---|---|
| JP | 61-119071 | 6/1986 |
| JP | 4-287360 A | 10/1992 |
| JP | 5-13909 | 1/1993 |
| JP | 5-67682 | 3/1993 |
| JP | 5-291511 | 11/1993 |
| JP | 6-37258 | 2/1994 |
| JP | 6-112320 | 4/1994 |
| JP | 7-74259 | 3/1995 |
| JP | 9-8233 | 1/1997 |
| JP | 9-199818 A | 7/1997 |
| JP | 9-326451 A | 12/1997 |
| JP | 10-41629 | 2/1998 |
| JP | 10-223997 | 8/1998 |
| JP | 11-233951 | 8/1999 |
| JP | 11-298096 A | 10/1999 |
| JP | 2000-077608 A | 3/2000 |

(Continued)

*Primary Examiner* — Junghwa M Im
(74) *Attorney, Agent, or Firm* — Fitzpatrick, Cella, Harper & Scinto

(57) ABSTRACT

An IC which includes a first circuit and a plurality of first paired terminals each including a first power supply terminal and a first GND terminal which are connected to the first circuit, and a second circuit and a plurality of second paired terminals each including a second power supply terminal and a second GND terminal which are connected to the second circuit. The first and second paired terminals are isolated inside. A printed board with the IC mounted has an inductor which is provided in a route that guides a wiring line from the first GND terminal to the second GND terminal and the GND of the printed board. The printed board has a portion where each of the first GND terminals is arranged inside the terminal array of the IC. The inductor suppresses a high-frequency potential variation generated by the operation of the first circuit.

15 Claims, 16 Drawing Sheets

FOREIGN PATENT DOCUMENTS

| | | |
|---|---|---|
| JP | 2001-119110 A | 4/2001 |
| JP | 2001-274558 | 10/2001 |
| JP | 2002-368545 A | 12/2002 |
| JP | 2003-69169 | 3/2003 |
| JP | 2003-133747 | 5/2003 |
| JP | 2003-282781 | 10/2003 |
| JP | 2005-183790 | 7/2005 |

* cited by examiner

F I G. 6A
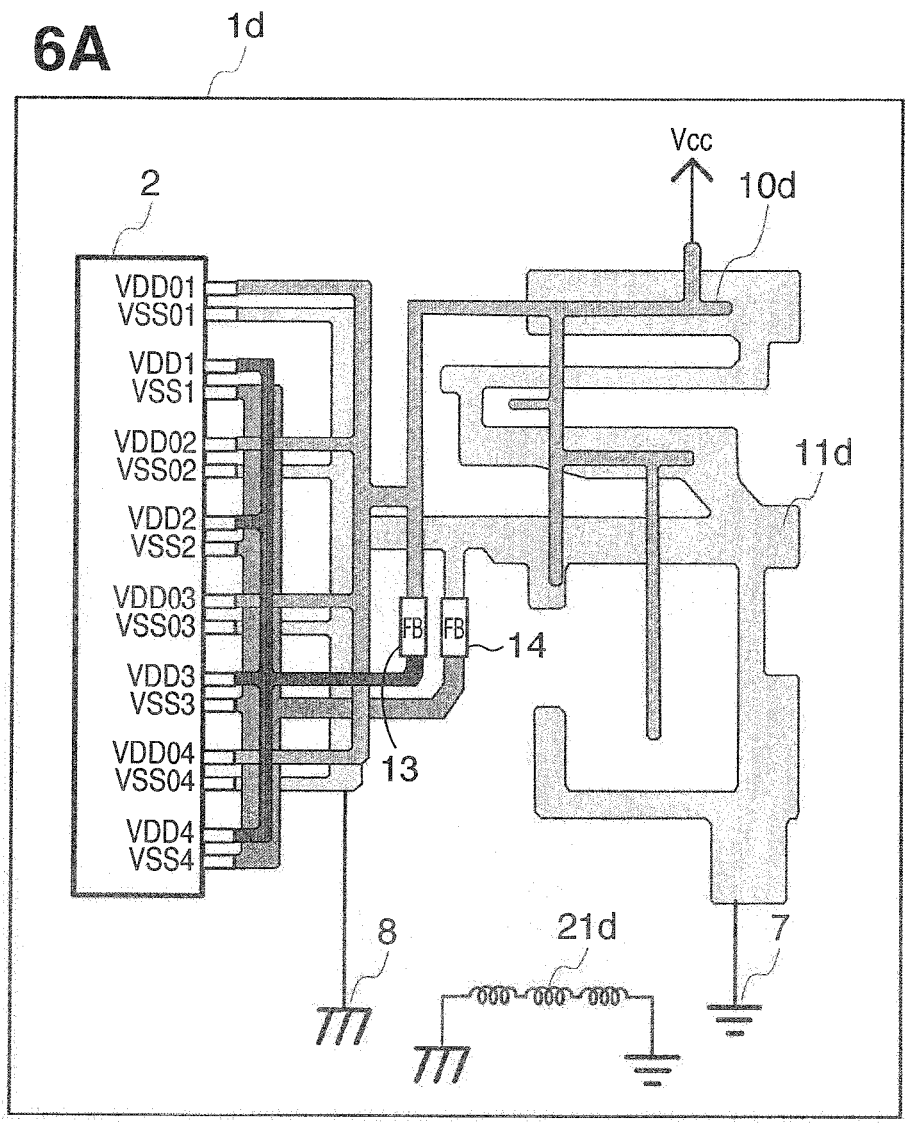
F I G. 6B
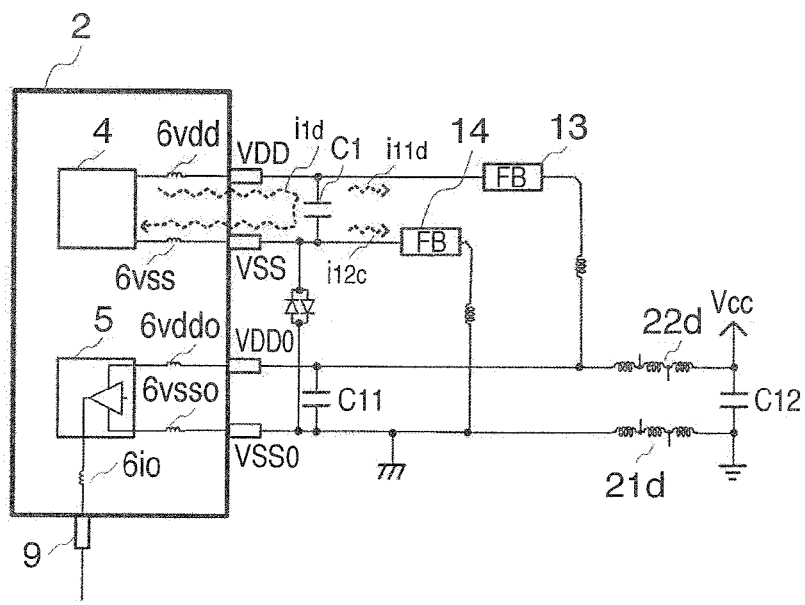

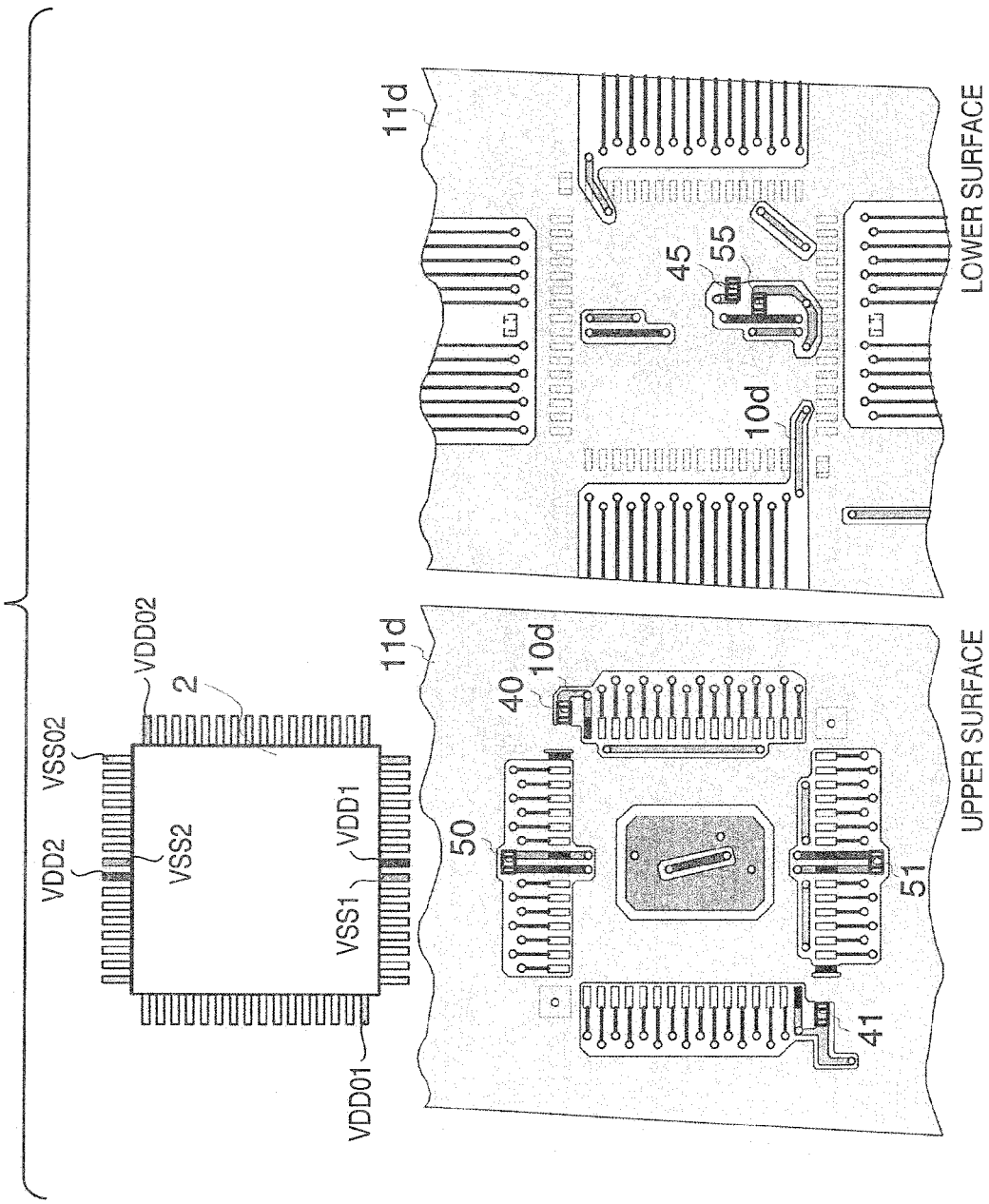

F I G. 10A
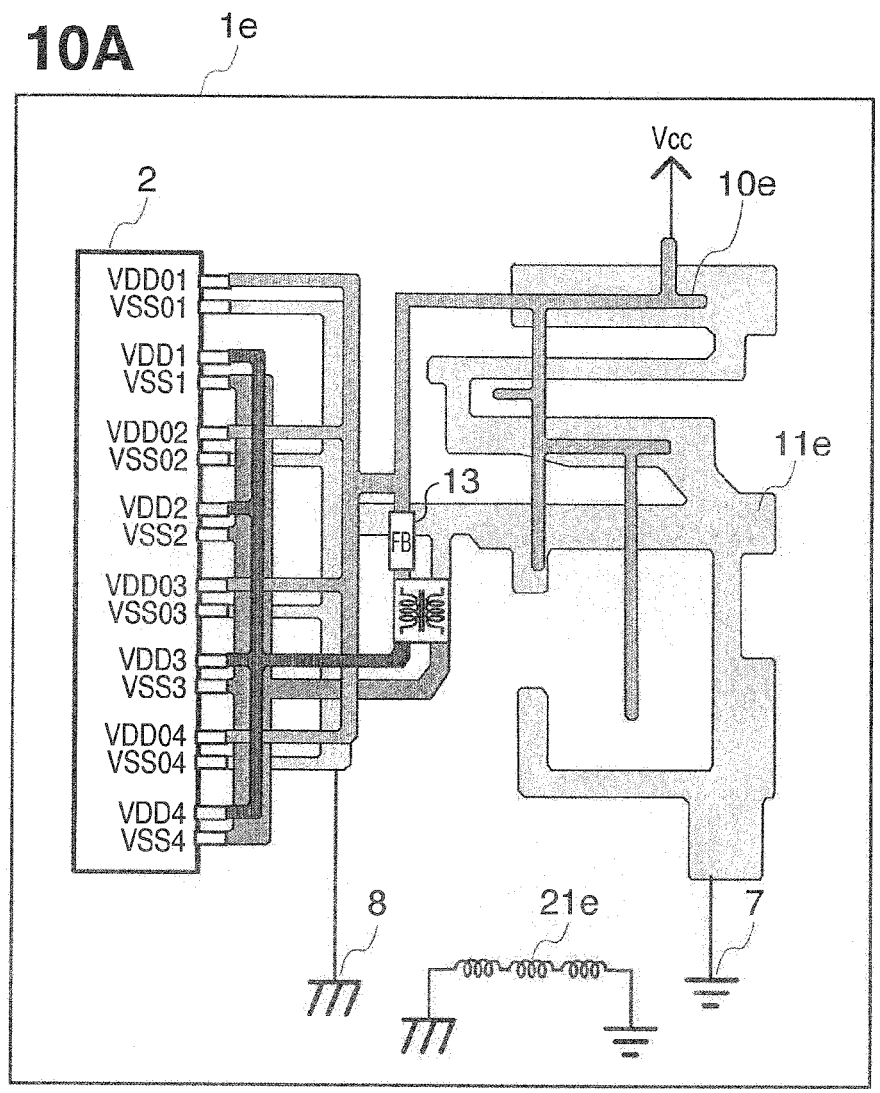
F I G. 10B
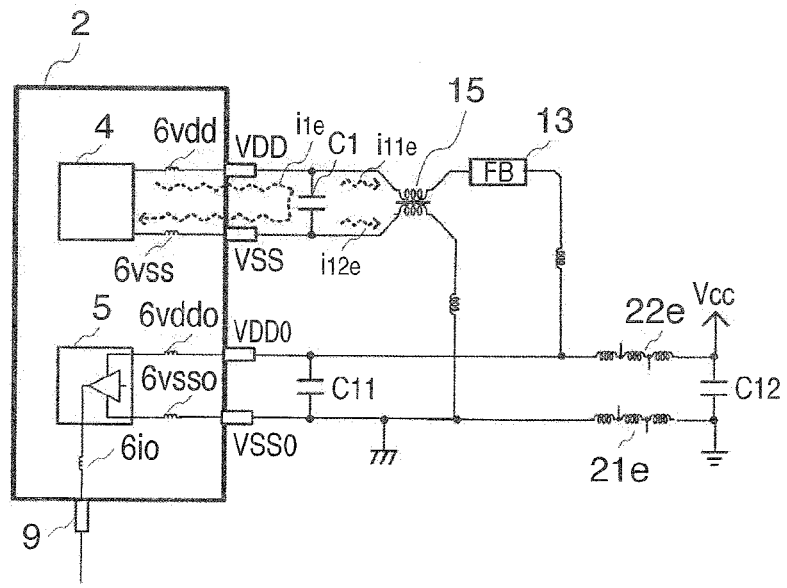

F I G. 16A
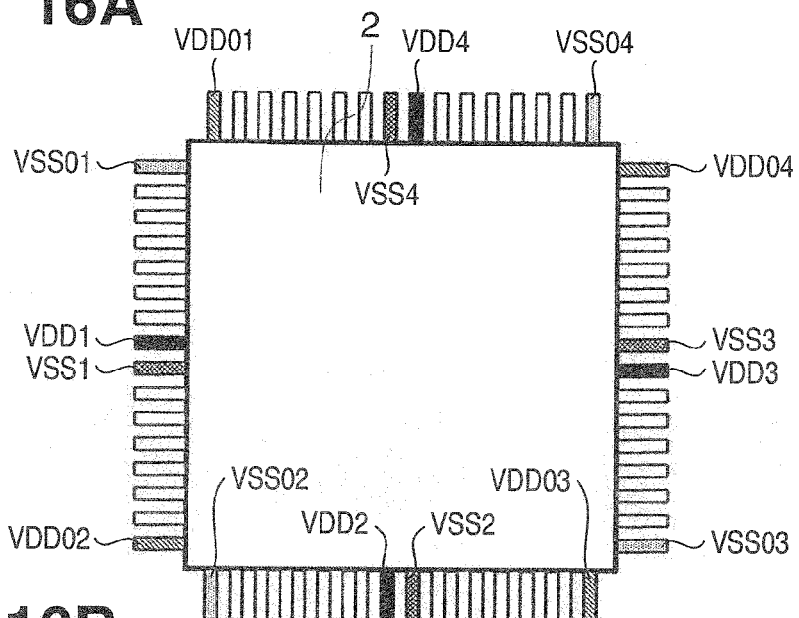
F I G. 16B
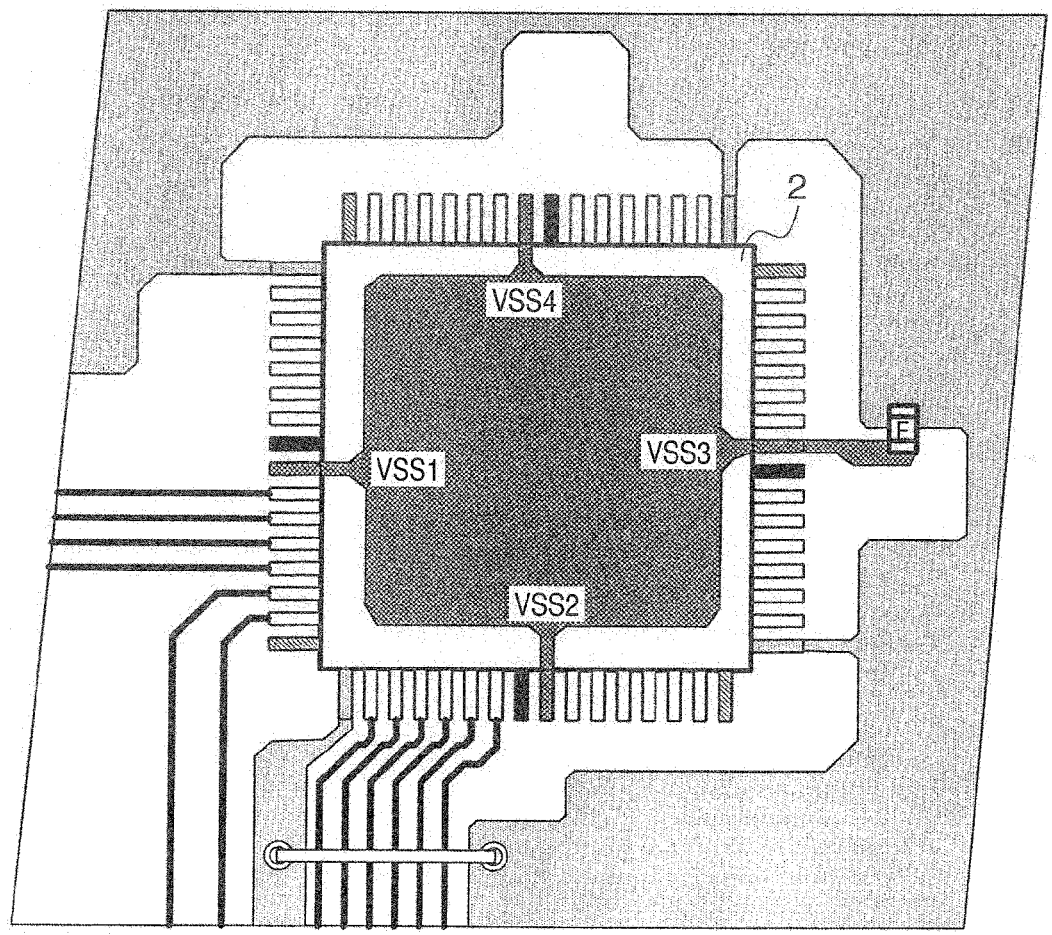

PRINTED BOARD AND SEMICONDUCTOR INTEGRATED CIRCUIT

BACKGROUND OF THE INVENTION

1. Field of the Invention

The present invention relates to a printed board and a semiconductor integrated circuit and, more particularly, to, e.g., an IC such as an ASIC having a plurality of power supply and GND terminals and a printed board with an IC mounted.

2. Description of the Related Art

In recent semiconductor integrated circuits (to be referred to as ICs hereinafter), the packaging density is increasing along with the progress of microfabrication technology, and the scale of circuits mounted in ICs is dramatically becoming large. Especially in an IC chip structure roughly divided into an internal core circuit and an I/O buffer part, the density in the internal core circuit rises. As a result, the number of switching elements such as CMOS formed in the internal core circuit increases, and the operation speed becomes higher year after year.

Since an enormous number of switching elements formed in the internal core circuit repeatedly turn on/off simultaneously in a clock cycle to operate the IC, an instantaneous carrying current is generated at the same timing. The instantaneous carrying current drops the voltage by an impedance that is parasitic to the path of the current flowing to wiring lines inside the IC and print patterns outside the IC. The periodical potential variation at a high frequency acts as a noise source. The noise is propagated through the printed board with the IC and even the entire device having the printed board.

The internal arrangement of an IC is roughly divided into an internal core circuit part and an I/O buffer part serving as an interface to an external device, as described above. In the conventional IC, the power supply wiring line of the internal core circuit part and the power supply wiring line and GND wiring line of the I/O buffer part are formed as a common wiring line in the IC.

When the power supply and GND wiring lines of the internal core circuit part and I/O buffer part are commonly formed in the IC, a high-frequency potential variation generated in the power supply and GND wiring lines of the internal core circuit part is propagated to those of the I/O buffer part. The high-frequency potential variation propagated to the power supply and GND wiring lines is output because connection to the power supply wiring line occurs when the signal output terminal of the I/O buffer part is at a high level (H) while connection to the GND wiring line occurs at a low level (L).

In addition, the high-frequency potential variation is propagated to the signal output terminal via a parasitic capacitance between the signal output terminal and the power supply wiring line of the I/O buffer part and a parasitic capacitance between the signal output terminal and the GND wiring line of the I/O buffer part. Even a parasitic capacitance with a high frequency drops the impedance so that the noise is propagated. For example, when the parasitic capacitance is 10 pF and the frequency of the noise component is 200 MHz, the impedance of the parasitic capacitance is about 80Ω. That is, the parasitic capacitance causes noise propagation to the signal output terminal although its magnitude changes depending on the magnitude of the parasitic capacitance in the I/O buffer part and the noise frequency.

The high-frequency potential variation propagated to the signal output terminal is propagated to the printed board, cable, and metal case and finally increases the radiant noise level from the device.

The signal input terminal of the I/O buffer part high-frequency-couples to the power supply wiring line and, more particularly, to the GND wiring line in the IC chip via the parasitic capacitance. For this reason, the high-frequency potential variation generated in the power supply and GND wiring lines by the instantaneous carrying current in the internal core circuit is propagated to the printed board via the terminal. This increases the radiant noise level from the device, as in the signal output terminal.

Under these circumstances, many techniques of isolating wiring lines in an IC have been proposed so far, mainly aiming at suppressing the above-described noise interference in the IC, as will be described below.

Japanese Patent Laid-Open No. 61-119071 (patent reference 1) discloses a wiring structure in an IC, in which at least one of the power supply of at least one specific circuit and a reference potential wiring line is electrically disconnected and insulated from the power supply of another circuit formed on the same chip as the specific circuit and/or the reference potential wiring line. Even when a large current flows to the specific circuit and generates noise, the noise pulse is not transmitted to other circuits. This prevents any circuit operation error by the noise.

Japanese Patent Laid-Open No. 5-67682 (patent reference 2) discloses a wiring structure in an IC, in which the power supply layer and ground layer of a semiconductor chip are isolated from a signal wiring line layer. In addition, each of the power supply layer and ground layer separately has an input buffer, output buffer, and internal logic circuit. This easily provides a measure against the influence of switching noise upon simultaneous operation of output buffers.

Japanese Patent Laid-Open No. 6-37258 (patent reference 3) discloses an IC having a double-layer structure which incorporates a circuit formed by connecting elements provided on a predetermined substrate by using wiring lines provided in a plurality of wiring layers. In particular, the IC includes a plurality of wiring lines which are formed in the plurality of wiring layers and have a layout pattern to isolate a circuit part serving as a noise source from a circuit part for reducing noise, and contacts for connecting the plurality of wiring lines. The IC further comprises a constant potential wiring line to connect the plurality of wiring lines connected to each other to a constant potential part. This suppresses a signal from a circuit part in the IC from being induced to another circuit part in the IC as noise.

Japanese Patent Laid-Open No. 6-112320 (patent reference 4) is related to an IC having first power supply and GND wiring lines and second power supply and GND wiring lines. According to patent reference 4, the first power supply and GND wiring lines are isolated from the second power supply and GND wiring lines. The first power supply and GND wiring lines connect to output buffer circuits which operate simultaneously. The second power supply and GND wiring lines connect to input/output buffer circuits other than the output buffer circuits. That is, patent reference 4 provides an effect of largely increasing the number of simultaneously operated output buffer circuits by isolating the power supply and GND wiring lines of the output and input buffer circuits which operate simultaneously.

Japanese Patent Laid-Open No. 7-74259 (patent reference 5) is related to a semiconductor memory having a plurality of output terminals. As a characteristic feature of patent reference 5, power supply and GND wiring lines connected to output transistors arranged for the output terminals are isolated from adjacent wiring lines. This can reduce the influence from peripheral circuits and the influence from other adjacent output circuits. Especially, the wiring width can be reduced by connecting some of power supply wiring lines or (GND wiring lines) arrayed in parallel, thus providing an effect of suppressing any increase in the area.

As the operation speed of an IC increases, the amount of noise generated by a variation in the GND or power supply voltage during the operation increases in the external output terminal. When the working voltage of the IC drops, the noise margin also decreases. Accordingly, an operation error caused by noise during use poses a serious problem. To solve this problem, Japanese Patent Laid-Open No. 5-291511 (patent reference 6) proposes an IC in which peripheral power supply and GND wiring lines for an external output terminal or external input/output terminal are separated, on the pattern in the IC, from internal circuit power supply and GND wiring lines which supply a power supply voltage to an internal circuit. This prevents noise generated in the former wiring lines from influencing the internal circuit connected to the latter wiring lines.

Japanese Patent Laid-Open No. 9-8233 (patent reference 7) is related to an IC having, as an internal circuit, a circuit which generates/outputs a periodic pulse signal and a circuit which operates on the basis of the periodic pulse signal. As a characteristic feature of the IC, each of the internal circuits and an output circuit including a load means for pulling up or down an input terminal and a driving means for driving an output terminal separately comprises power supply and GND wiring lines and power supply and GND terminals. Circuits which often process the periodic pulse signal are grouped as the internal circuits and separated from the power supply system of the output circuit including the load means for pulling up or down the input terminal and the driving means for driving the output terminal. Harmonic noise generated in the internal circuits does not radiate not only from the output terminal but also from the input terminal that is pulled up or down. Patent reference 7 can limit the noise radiation source to only the power supply system of the internal circuits and reduce the periodic spectral harmonics electromagnetically radiated from the IC.

The power supply wiring line and GND wiring line isolated from each other in the IC are high-frequency-isolated by the inductance component parasitic to the wiring part in the semiconductor chip and the parasitic inductance component of the bonding wires that connect the semiconductor chip to the lead frame. Hence, it is possible to prevent any operation errors and noise propagation independently of the pattern wiring on the printed board.

As described above, many techniques of isolating the power supply and GND wiring lines of each functional block from those of other functional blocks in an IC have been disclosed to prevent various kinds of noise interference in the IC.

Even for a printed board with a plurality of ICs, various proposals have been made to solve the problems concerned with noise, such as radiant noise and operation errors, by isolating the power supply wiring lines or GND wiring lines of the ICs or separating a high frequency by using, e.g., an inductance element.

For example, each of Japanese Patent Laid-Open No. 5-13909 (patent reference 8), Japanese Patent Laid-Open No. 10-41629 (patent reference 9), Japanese Patent Laid-Open No. 10-223997 (patent reference 10), Japanese Patent Laid-Open No. 11-233951 (patent reference 11), Japanese Patent Laid-Open No. 2001-274558 (patent reference 12), Japanese Patent Laid-Open No. 2003-69169 (patent reference 13), Japanese Patent Laid-Open No. 2003-133747 (patent reference 14), and Japanese Patent Laid-Open No. 2003-282781 (patent reference 15) discloses a printed board in which the wiring line of the external power supply terminal or GND terminal of an IC is physically pattern-isolated or isolated by using an inductance element from those of other ICs mounted on the printed board.

Patent reference 15 discloses a multi-layered circuit board with an IC such as an ASIC having a plurality of power supply terminals and GND terminals. Patent reference 15 discloses the following arrangement to provide a circuit board capable of reducing EMI noise radiated from the circuit board while suppressing the number of bypass capacitors. A main power supply plane and a sub power supply plane which is formed into an island shape and has a clearance to ensure electrical disconnection from the main power supply plane are provided in a first layer. A first power supply pattern which is formed in a layer different from the first layer and connected to a bypass capacitor connects the main power supply plane to the sub power supply plane. Power supply to at least some power supply terminals of the IC is done via a second power supply pattern which connect to the sub power supply plane without intervening a bypass capacitor.

As described above, the packaging density of an internal core circuit is increasing every day along with the progress of microfabrication technology. The number of switching elements such as CMOS formed in the internal core circuit is further increasing, and its operation speed is constantly becoming higher.

The arrangements proposed by patent references 1 to 7, which isolate power supply and GND wiring lines in an IC to prevent noise generated in the internal core circuit of the IC from being propagated to other block circuits, do not suffice. In other words, improvements from two aspects, i.e., a measure for the internal arrangement of an IC and an improved pattern wiring method for a printed board are necessary.

Patent references 8 to 14 disclose a printed board with a plurality of ICs in which the power supply patterns or GND patterns of the ICs are isolated by wiring or by using inductance elements. These arrangements can prevent a high-frequency potential variation that occurs in the power supply terminal or GND terminal of each of the ICs separately mounted on the printed board from being propagated to the power supply terminals or GND terminals of other ICs.

However, in an IC such as an ASIC having a plurality of functional blocks in one package, each functional block has a power supply terminal and a GND terminal. The power supply terminals or GND terminals of a single IC are connected by one wiring line on the printed board. For this reason, a potential variation caused by a high-frequency current generated in the internal core circuit is propagated to the power supply terminals or GND terminals of all I/O buffers via the pattern on the printed board. Hence, the high-frequency potential variation is propagated to input/output signal lines from all I/O buffers.

As a result, the high-frequency potential variation propagated to the signal input terminals and signal output terminals is propagated to the printed board, cable, and metal case as high-frequency noise. The cable serves as an antenna to radiate the propagated noise. The metal case may serve as a noise radiant antenna depending on its shape. For example, a metal case formed by juxtaposing flat metal sheets at very short intervals or a plurality of cases having a long gap at their joints, serve as antennas.

In a device formed by wholly enclosing the printed board and the cable by a box-shaped metal case, noise propagated to the cable is finally shielded by the BOX-shaped metal case. Hence, the radiant noise level from the device is low. In the BOX-shaped metal case enclosing the device, the metal sheets contact each other at many joints so that the radiant noise level from the device is low. Examples of a device enclosed by a BOX-shaped metal case are measuring instruments such as an oscilloscope and a personal computer.

However, if it is difficult to wholly enclose a device by a BOX-shaped metal case, noise propagated to the cable is not suppressed, and finally, the radiant noise level from the device becomes high.

For example, an image forming apparatus is equipped with not only electrical parts such as a printed board and a cable but also many parts for an electrophotographic process. It also includes a number of parts such as a cartridge and a fixing device which are changed by the user. A paper feed cassette is also provided as a printing medium supply unit. In this case, enclosing the whole device degrades usability. To partially enclose only the printed board and cable by a metal case, a lot of complex parts are necessary, resulting in an increase in the size and cost of the device.

When the I/O port of an ASIC connects to only another IC in the same printed board, the influence on radiant noise is small because there is no connection to the cable serving as an antenna. In an image forming apparatus, however, the ASIC often has a number of I/O ports which are connected to circuits on other printed boards via cables. This increases the influence on radiant noise.

In patent reference 15, a plurality of power supply terminals provided in one IC are distributed to the main power supply plane and a sub power supply plane which is formed into an island shape and has no bypass capacitor. Power to some terminals is selectively supplied from the power supply planes. This arrangement can reduce the number of bypass capacitors and prevent common-mode noise generated by, e.g., the high-speed switching operation of the IC for leaking to the main power supply plane. According to patent reference 15, a GND plane layer connected to a ground potential is formed so that the internal logic GND terminal of the ASIC connects to a stable GND potential. For this reason, noise leakage from the internal logic GND poses no serious problem.

However, if the IC operation becomes quicker, and its harmonic noise reaches a noise frequency where the impedance of the GND plane is no longer negligible, the current flowing to the GND plane layer formed as a common impedance changes to a noise source. The noise frequency is, e.g., approximately 500 MHz to 5 GHz. This makes the GND potential of the IC unstable in the high-frequency band. The high-frequency noise generated in the GND plane increases the EMI noise level radiated from the circuit board. To reduce the inductance component of the GND plane, a conductive layer (generally, 35-µm thick copper foil) is thickened by several times. However, this increases the cost.

In a single-layered single-sided printed board or a two-layered double-sided printed board, the inductance component of the GND plane is relatively large. For this reason, the wiring impedance of the GND pattern has an effect even in a lower frequency band (e.g., 100 MHz to 200 MHz band). This makes the GND potential of the IC unstable. The high-frequency noise propagated to the GND pattern is propagated to the power supply terminal of the I/O buffer part via the GND terminal of the I/O buffer part and the bypass capacitor. That is, the high-frequency noise is propagated to all input/output signal terminals of the IC.

As described above, in a single-layered single-sided printed board or a two-layered double-sided printed board, it is impossible to form a power supply plane and GND plane capable of supplying a stable power supply voltage and reference GND potential to the entire printed board. As a measure against noise, the GND pattern is connected by a solid GND structure which is as close to a four-layered board as possible. An ASIC mounted on a single-layered single-sided printed board or a two-layered double-sided printed board is rarely a very high speed, large scale integrated circuit, unlike an IC mounted on a four-layered printed board, from the viewpoint of the application purpose. Hence, a measure against noise is taken by making the area of the solid GND as large as possible.

However, even in an ASIC which is mounted on a single-layered single-sided printed board or a two-layered double-sided printed board and operates at a relatively low clock speed (e.g., about 10 MHz to 20 MHz), the packaging density of the internal core circuit is increasing year after year. As a result, the number of switching elements such as CMOS used in the internal core circuit is increasing, and the operation speed is becoming higher.

Even when the system clock speed used for an actual operation is as low as about 20 MHz, the rise speed (Tr) and fall speed (Tf) of a system clock pulse used in an internal operation exhibit a steep signal waveform. This increases the instantaneous carrying current that flows due to switching of the internal core circuit driven by the system clock.

The frequency of the recently used system clock is also becoming higher in inverse proportion to the decrease in the cost of the IC. Since the rise speed (Tr) and fall speed (Tf) of the system clock pulse increase, and the speed of the system clock itself also increases, the frequency band of the harmonic component contained in radiant noise becomes high. When the frequency of the radiant noise component is high, the impedance value by the pattern wiring on the printed board increases, and the GND potential of the printed board becomes increasingly unstable. In the single-layered single-sided printed board or two-layered double-sided printed board incapable of forming a flat power supply wiring line or GND wiring line, unlike the four-layered printed board, the impedance up to a relatively stable frame GND increases so that the influence on the GND terminal potential of the IC increases more and more.

For example, the power supply and GND terminals of the internal core part and those of I/O buffer parts provided in a single IC are arranged almost at the same location in consideration of the size of the entire printed board. For this reason, in the IC having a number of power supply and GND terminals, the wiring impedance between the power supply terminals or GND terminals is smaller than the impedance up to the frame GND, and interference in a high-frequency band occurs more readily than before. That is, the high-frequency potential variation generated in the power supply and GND terminals of the internal core circuit is more easily propagated to those of the I/O buffer unit via the pattern wiring on the printed board. Consequently, the radiant noise level propagated to the signal input/output terminals of the I/O buffer unit becomes high.

In addition, if the single-layered single-sided printed board or two-layered double-sided printed board is changed to a four-layered printed board to form a solid GND with a low impedance, the cost of the printed board largely rises.

The high-frequency potential variation is propagated to the power supply and GND wiring lines on the printed board and all signal input/output lines from the I/O buffer. To prevent this, it is necessary to add a filter onto the printed board or use a ferrite core or shield metal sheet. However, these measures require a very long design time and high cost.

SUMMARY OF THE INVENTION

The present invention has been made in consideration of the above-described prior art, and provides a printed board which is applicable to printed boards of all types including single-layered, two-layered, and four-layered printed boards and capable of suppressing radiation from a noise source with an inexpensive and simple structure. It is particularly preferable to apply the present invention to a printed board with an IC having a number of pairs of power supply and GND terminals which are isolated inside.

The IC having a number of pairs of power supply and GND terminals which are isolated inside indicates an IC which has an external connection power supply terminal and a GND terminal for each type of functional blocks in the IC. It also indicates an IC having a plurality of pairs of power supply and GND terminals which are externally connected.

According to one aspect of the present invention, the foregoing problem is solved by providing a printed board comprising, a first circuit, a plurality of first paired terminals, each of which includes a first power supply terminal and a first GND terminal which are connected to the first circuit, a second circuit, a second paired terminal including a second power supply terminal and a second GND terminal which are connected to the second circuit, an IC in which the first paired terminal and the second paired terminal are isolated, and a first suppressing unit adapted to suppress a high-frequency potential variation generated by an operation of the first circuit, the first suppressing unit being arranged in a route that guides a wiring line from the first GND terminal to the second GND terminal and a GND pattern of the printed board, wherein the first GND terminals of the plurality of first paired terminals are connected by a short-distance pattern near the IC.

According to another aspect of the present invention, the foregoing problem is solved by providing A semiconductor integrated circuit comprising a first circuit, a first pair internal wiring line including a first power supply internal wiring line and a first GND internal wiring line which are connected to the first circuit, a second circuit, a second pair internal wiring line including a second power supply internal wiring line and a second GND internal wiring line which are connected to the second circuit, the first pair internal wiring line and the second pair internal wiring line being isolated, and a first internal suppressing unit adapted to suppress a high-frequency potential variation generated by an operation of the first circuit, the first internal suppressing unit being arranged in an internal route that guides the first GND internal wiring line to the second GND internal wiring line and an external connection GND terminal of the semiconductor integrated circuit, and a first internal charge accumulation unit connected between the first power supply internal wiring line and the first GND internal wiring line.

Further features of the present invention will become apparent from the following description of exemplary embodiments with to the attached drawings.

BRIEF DESCRIPTION OF THE DRAWINGS

FIGS. 6A and 6B are views showing connection between an IC and a printed wiring board which suppresses radiant noise from the IC according to the first embodiment of the present invention;

FIG. 8 is a view showing an example of pattern wiring when an IC 2 is mounted on a two-layered double-sided printed board;

FIGS. 10A and 10B are views showing connection between an IC and a printed wiring board which suppresses radiant noise from the IC according to the second embodiment of the present invention;

FIGS. 16A and 16B are views showing an example of pattern wiring when an IC 2 is mounted on a printed board.

DESCRIPTION OF THE EMBODIMENTS

Preferred embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

An IC to be described in several embodiments below is an ASIC incorporating an integrated circuit with several ten thousand to several hundred thousand gates.

An IC structure serving as a source of unwanted radiant noise and the radiant noise generation mechanism of the IC will be explained first as an arrangement common to the following embodiments. The radiant noise generation mechanism of the IC was elucidated in association with the present invention.

<Explanation of IC>

Figure 1A:
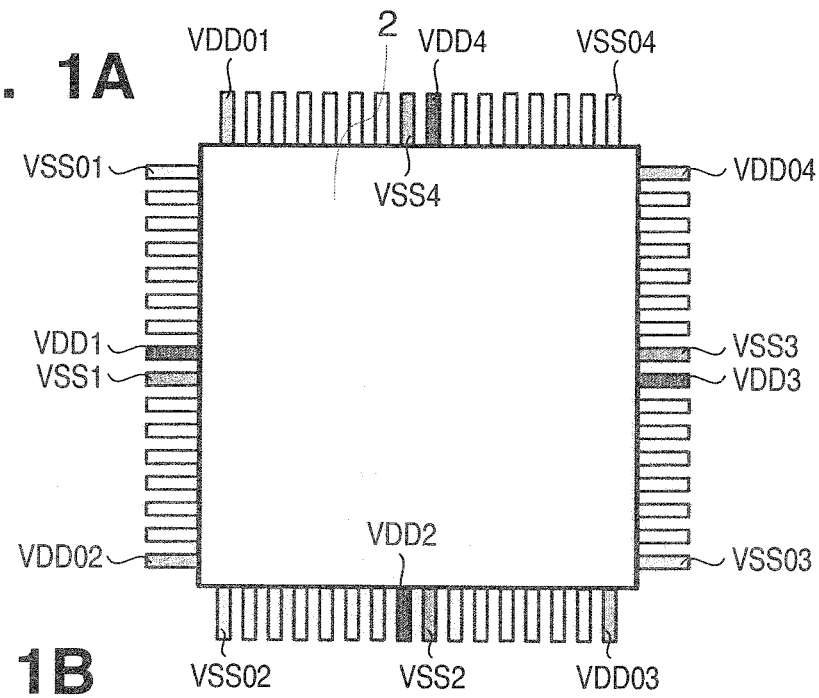
FIGS. 1A and 1B are views showing the internal arrangement of an IC according to a representative embodiment of the present invention.
Figure 1B:
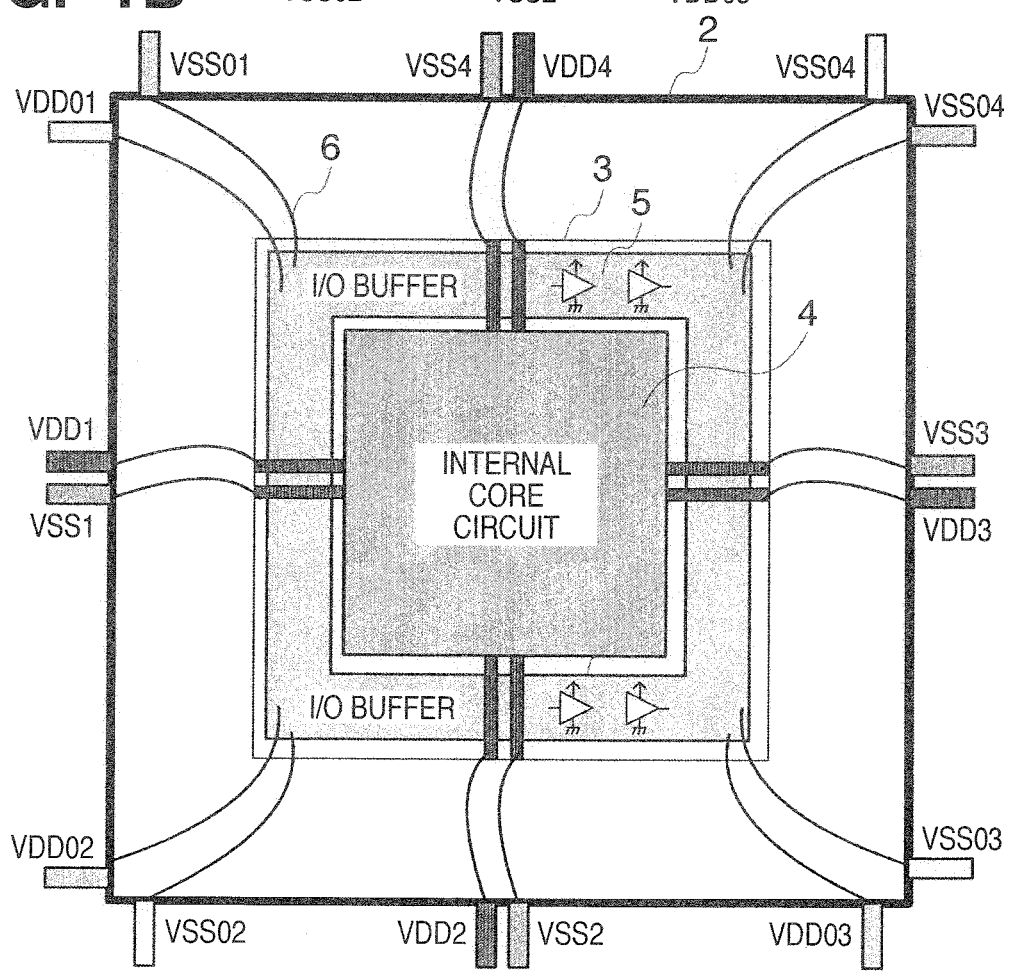

FIGS. 1A and 1B are views showing the internal arrangement of an IC according to a representative embodiment of the present invention. This IC generates high-frequency noise. That is, the IC serves as a radiant noise source.

FIG. 1A is a view showing the outer appearance of the mold package of the IC. For the descriptive convenience, FIG. 1A illustrates an example of a 64-pin QFP package which has a relatively small number of pins for the IC. Each side of the package has 16 pins, i.e., lead terminals. The sides have, at their central portions, power supply terminals VDD1 to VDD4 and GND terminals VSS1 to VSS4 for an internal core circuit, respectively. Additionally, the sides have, at their ends, power supply terminals VDDO1 to VDDO4 and GND terminals VSSO1 to VSSO4 for an I/O buffer part, respectively.

Figure 2:
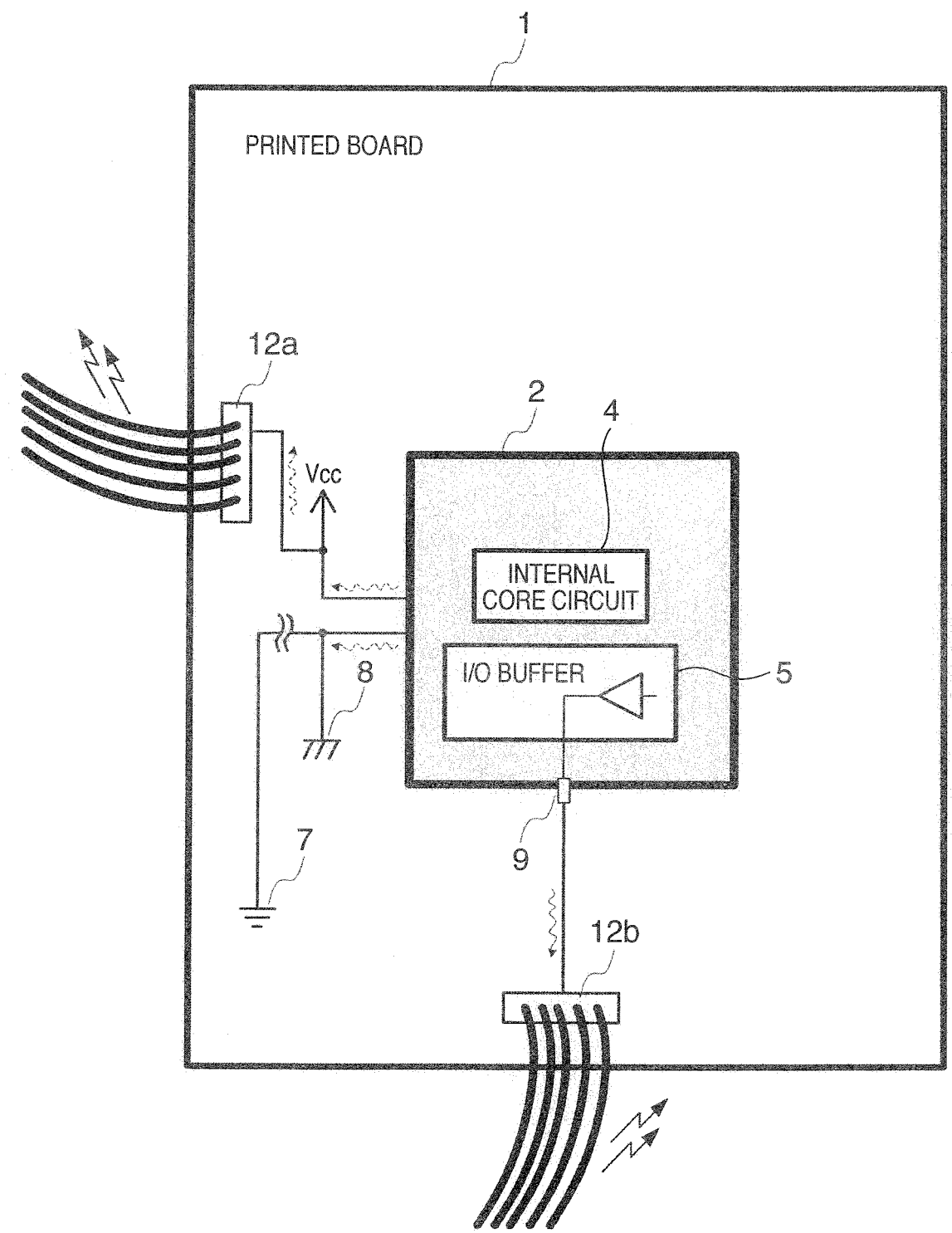
FIG. 2 is a view showing radiant noise generation by the IC.

FIG. 1B schematically shows the internal arrangement of the IC. As shown in FIG. 2, an IC 2 includes an internal core circuit part 4, I/O buffer part 5, and bonding wires 6 which are formed as a semiconductor chip 3. Actually, the internal lead portions of a lead frame are formed in the IC. FIG. 1B does not illustrate the internal leads for convenience. The bonding wires 6 connect the semiconductor chip 3 in the package to the lead frame. More specifically, the power supply wiring lines and GND wiring lines of the internal core circuit 4 and I/O buffer part 5 connect to the power supply wiring line pattern and GND wiring line pattern on a printed board via the bonding wires 6 and the lead frame including internal and external leads.

As described in "BACKGROUND OF THE INVENTION", when the IC incorporates a plurality of functional block parts, noise interference make troubles unless the power supply and GND wiring lines of each functional block part are isolated from those of the remaining functional block parts.

In the ASIC according to this embodiment, the power supply wiring lines of the internal core circuit 4 and those of the I/O buffer part 5 are isolated from each other, as shown in FIG. 1B. The GND wiring lines of the internal core circuit 4 and those of the I/O buffer part 5 are also isolated from each other.

<Radiant Noise Generation Mechanism of IC>

FIG. 2 is a view showing radiant noise generation by the IC.

As shown in FIG. 2, the IC 2 and connectors 12a and 12b are mounted on a printed board 1. A signal line output from the I/O buffer 5 of the IC 2 connects to the connector 12b. Cables to be connected to other printed boards connect to the connector 12b. A power supply voltage Vcc to be supplied to the IC 2 connects to the connector 12a connected to cables. The GND terminal of the IC 2 connects to a signal GND 8 of the printed board 1. The GND pattern of the printed board 1 connects to a frame GND 7.

A high-frequency noise variation propagated to an output signal terminal 9 of the I/O buffer 5 of the IC 2 is propagated to the cables connected to the connector 12b and radiated from the cables serving as an antenna.

On the other hand, a high-frequency noise variation propagated to the power supply terminal of the IC 2 is propagated to the power supply pattern Vcc on the printed board. The high-frequency potential variation is propagated to all parts that receive the power supply voltage Vcc. Since the pattern to apply the power supply voltage Vcc connects to the connector 12a, the high-frequency noise variation is radiated from the cables serving as an antenna.

The inductance of the signal GND 8 of the printed board 1 changes depending on the solid GND area. A multilayered printed board has a GND plane with a very small inductance component. Hence, the signal GND 8 receives a relatively stable GND potential, like the frame GND 7.

In a single-layered single-sided printed board or two-layered double-sided printed board having no GND plane, the inductance component of the GND pattern is large. Hence, the potential of the signal GND 8 is relatively unstable. In the IC 2, a high-frequency potential variation occurs not only in the power supply terminal but also in the GND terminal so that radiant noise is generated.

Radiant noise from a four-layered printed board, two-layered double-sided printed board, and single-layered single-sided printed board will be described next in more detail.

1. Radiant Noise from Four-layered Printed Board

Figure 3A:
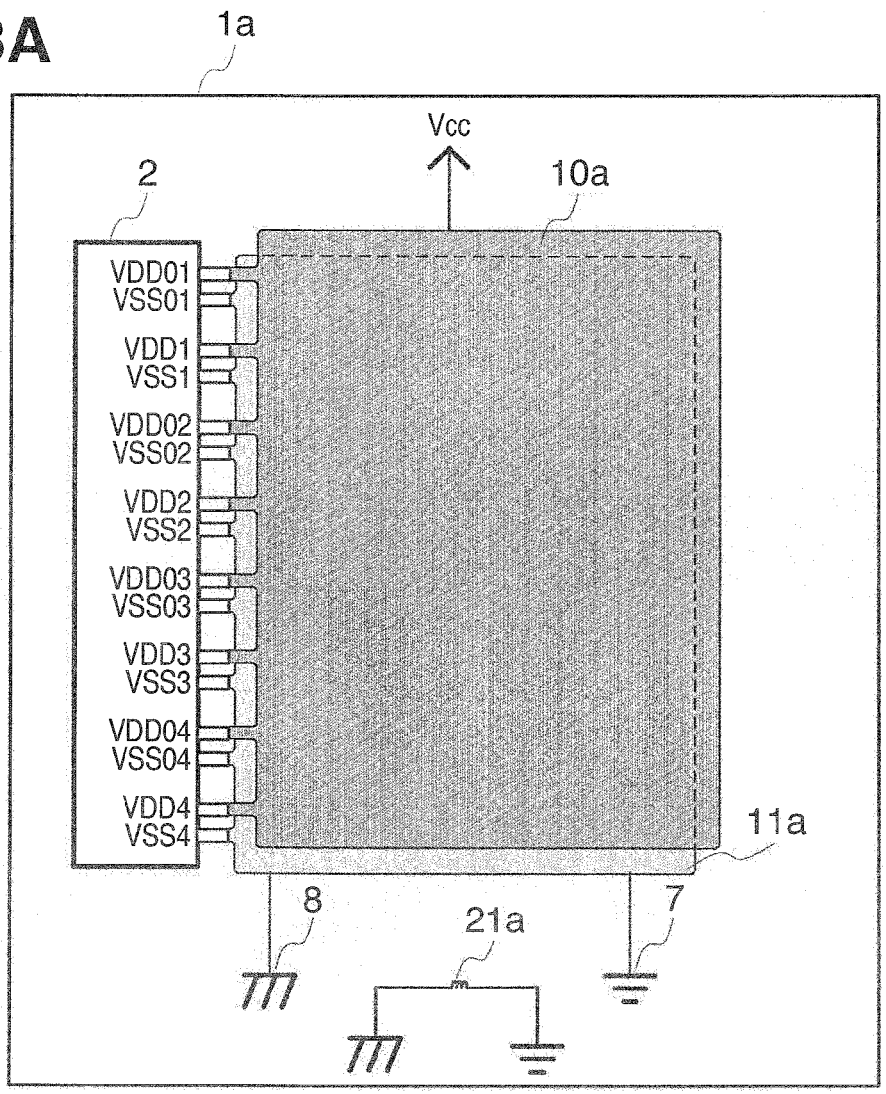
FIGS. 3A and 3B are views showing an IC mounted on a four-layered printed board and its connection state.
Figure 3B:
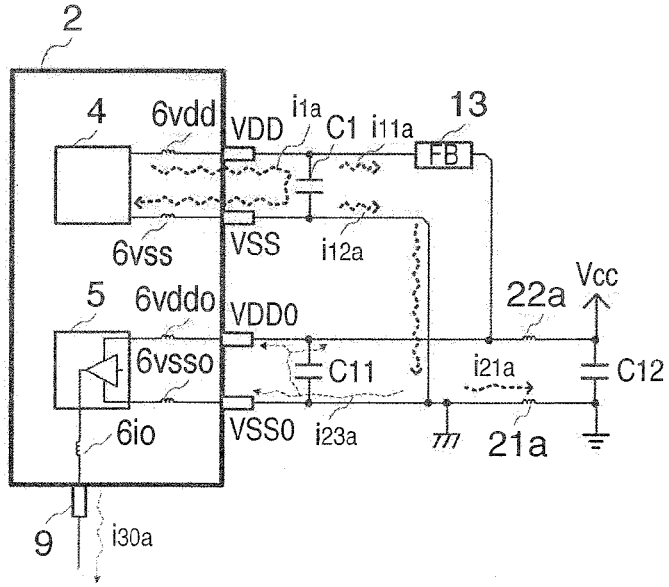

FIGS. 3A and 3B are views showing an IC mounted on a four-layered printed board and its connection state.

FIG. 3A schematically shows connection between the IC 2 and a four-layered printed board pattern. As shown in FIGS. 1A and 1B, the terminals of the IC are generally arranged at positions uniformly distributed throughout the package. That is, the power supply terminals VDDO1 to VDDO4 are arranged at the ends of the sides. The power supply terminals VDD1 to VDD4 are arranged at the central portions of the sides. In the present invention, the IC 2 has the VDDO terminals and VDD terminals alternately arranged, as shown in FIG. 3A. FIG. 3A schematically shows only one array of terminals for the sake of simplicity. Actually, VDD1 and VDD4 are arranged as power supply terminals adjacent to VDDO1. This also applies to the GND terminals VSSO and VSS.

As shown in FIG. 3A, the power supply terminals VDDO1 to VDDO4 and VDD1 to VDD4 of the IC 2 connect to a power supply plane 10a of a printed board 1a. On the other hand, the GND terminals VSSO1 to VSSO4 and VSS1 to VSS4 of the IC 2 connect to a GND plane 11a serving as the signal GND 8 of the printed board 1a. The GND plane 11a also connects to the frame GND 7. An inductance component 21a of the GND plane 11a is very small. For this reason, the GND terminals VSSO1 to VSSO4 and VSS1 to VSS4 of the IC 2 connect to the relatively stable frame GND 7 with a low impedance and therefore ensure a stable ground potential.

No bypass capacitor is illustrated for the sake of simplicity.

FIG. 3B schematically shows the noise propagation route on the four-layered printed board. In FIG. 3B, the internal core power supply terminals VDD1 to VDD4 and internal core GND terminals VSS1 to VSS4 of the IC 2 are illustrated as an internal core power supply terminal VDD and an internal core GND terminal VSS, respectively, for the descriptive convenience. Additionally, the I/O buffer power supply terminals VDDO1 to VDDO4 and I/O buffer GND terminals VSSO1 to VSSO4 of the IC 2 are illustrated as an I/O buffer power supply terminal VDDO and an I/O buffer GND terminal VSSO, respectively.

A bypass capacitor C1 is connected between the power supply terminal VDD and the GND terminal VSS of the IC 2. A bypass capacitor C11 is connected between the power supply terminal VDDO and the GND terminal VSSO. The power supply voltage Vcc supplied to the printed board 1 is applied to a bypass capacitor C12 which is arranged relatively near the frame GND 7.

As described above, the pins of the IC 2 connect to the semiconductor chip 3 via bonding wires. FIG. 3B illustrates bonding wires 6vdd, 6vss, 6vddo, and 6vsso connected to the pins, i.e., VDD, VSS, VDDO, and VSSO terminals, respectively. These bonding wires include a parasitic inductance component. As shown in FIG. 3B, the power supply voltage Vcc supplies the power supply voltage to the power supply terminal VDD via a ferrite bead 13.

Upon high-speed switching of transistors integrated in the internal core circuit 4, a high-frequency current i1a flows to the power supply terminal VDD and GND terminal VSS via the bonding wire 6vdd, bypass capacitor C1, bonding wire 6vss, and wiring lines in the internal core circuit 4. The current path of the high-frequency current i1a has a parasitic inductance. Hence, common-mode noise currents i11a and i12a are generated in the power supply terminal VDD and GND terminal VSS.

The high-frequency impedance of the ferrite bead 13 suppresses propagation of the noise current i11a to the power supply terminal VDDO and power supply Vcc. The noise current i12a changes to a normal-mode noise current i21a and flows to the frame GND 7 via the GND plane 11a with a low impedance. However, since the inductance 21a of the GND plane 11a is low, a voltage drop caused by the noise current i21a is very small. Hence, the noise level propagated to the GND plane in the printed board 1 is low.

2. Radiant Noise from Two-layered Double-sided Printed Board FIGS. 4A and 4B are views showing an IC mounted on a two-layered double-sided printed board and its connection state.

Figure 4A:
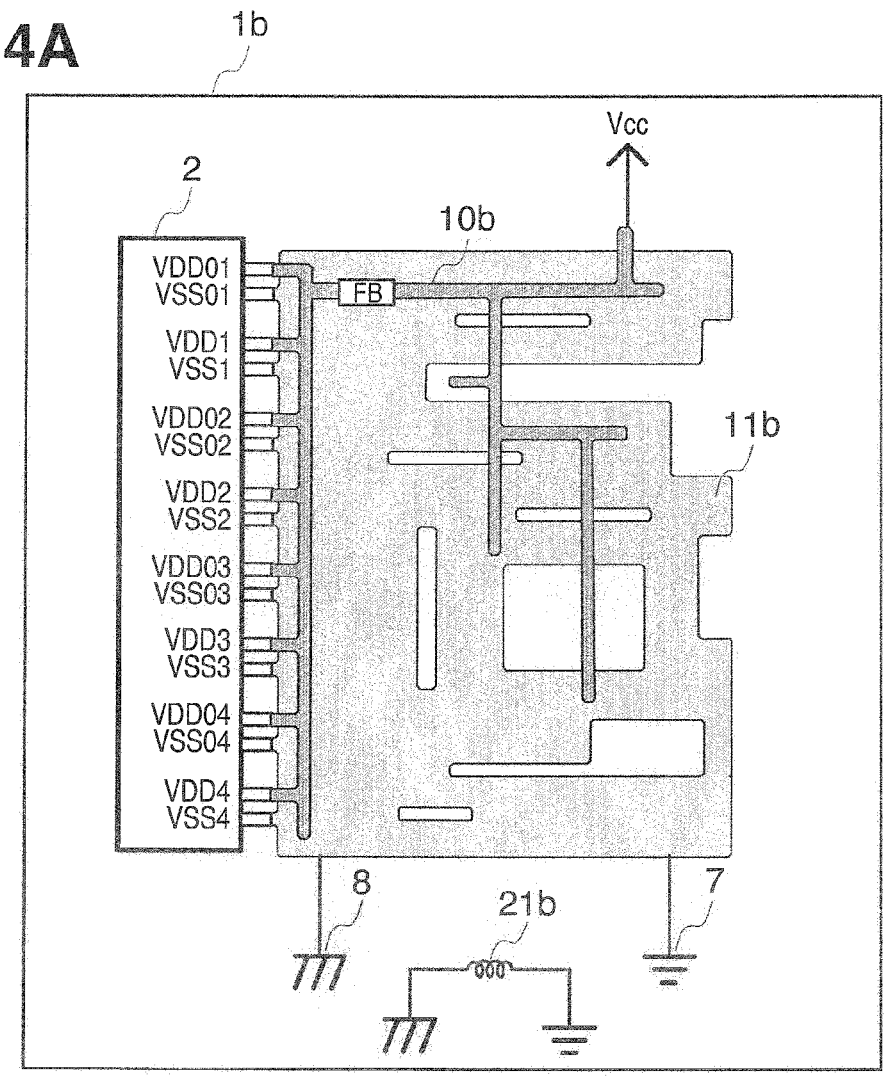
FIGS. 4A and 4B are views showing an IC mounted on a two-layered double-sided printed board and its connection state.
Figure 4B:
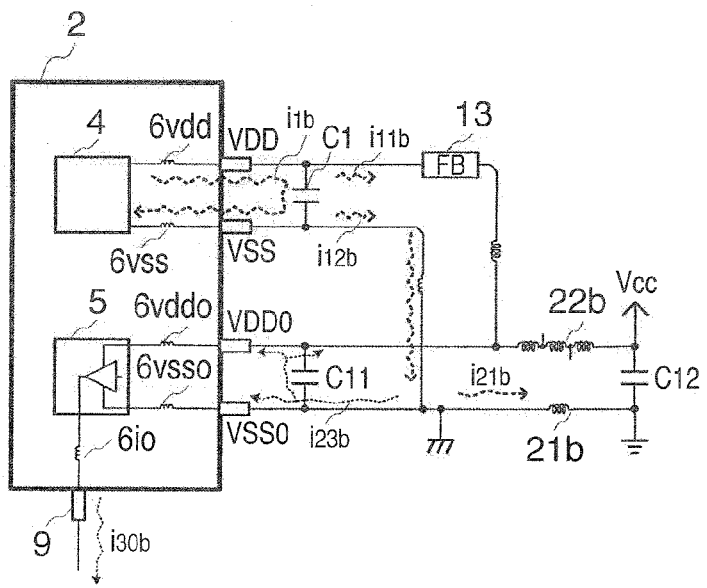

FIG. 4A schematically shows connection between the IC 2 and a printed board pattern. In this example, a power supply pattern 10b and GND pattern 11b generally connect the solder surface layer and component surface layer via many VIAs. These layers are not illustrated for the descriptive convenience. FIG. 4A shows the areas of the power supply pattern and GND pattern on a printed board 1b.

As shown in FIG. 4A, the power supply terminals VDDO1 to VDDO4 and VDD1 to VDD4 of the IC 2 connect to the power supply pattern 10b of the printed board 1b. On the other hand, the GND terminals VSSO1 to VSSO4 and VSS1 to VSS4 of the IC 2 connect to the GND pattern 11b serving as the signal GND 8 of the printed board 1b. The GND pattern 11b also connects to the frame GND 7. The GND terminals VSSO1 to VSSO4 and VSS1 to VSS4 of the IC 2 connect to the frame GND 7 via a relatively small inductance component 21b of the GND pattern 11b.

No bypass capacitor is illustrated for the sake of simplicity.

FIG. 4B schematically shows the noise propagation route on the two-layered double-sided printed board. The same reference symbols as in FIG. 3B described above denote the same constituent elements in FIG. 4B, and a description thereof will be omitted.

Upon high-speed switching of transistors integrated in the internal core circuit 4, a high-frequency current i1b flows to the power supply terminal VDD and GND terminal VSS via the bonding wire 6vdd, bypass capacitor C1, bonding wire 6vss, and wiring lines in the internal core circuit 4. The current path of the high-frequency current i1b has a parasitic inductance. Hence, common-mode noise currents i11b and i12b are generated in the power supply terminal VDD and GND terminal VSS.

The high-frequency impedance of the ferrite bead 13 suppresses propagation of the noise current i11b to the power supply terminal VDDO and power supply Vcc. The noise current i12b changes to a normal-mode noise current i21b and flows to the frame GND 7 via the inductance component 21b.

In this arrangement, although the inductance component 21b of the GND pattern 11b is relatively small, the magnitude of voltage drop caused by the noise current i21b is nonnegligible. A high-frequency potential variation is caused in the GND terminal VSSO by the high-frequency noise current i21b and inductance 21b and propagated to the power supply terminal VDDO via the bypass capacitor C1. The output signal terminal 9 of the I/O buffer 5 outputs the potentials of the GND terminal VSSO and power supply terminal VDDO of the I/O buffer 5 as high-level (H) and low-level (L) signals. The high-frequency potential variation is propagated to the signal output terminal via the parasitic capacitance between the signal output terminal and the power supply wiring line of the I/O buffer 5 and the parasitic capacitance between the signal output terminal and the GND wiring line of the I/O buffer 5. That is, the high-frequency potential variation propagated to the power supply terminal VDDO and GND terminal VSSO is superimposed on all input/output signals of the I/O buffer 5.

3. Radiant Noise from Two-layered Double-sided Printed Board or Single-layered Single-sided Printed Board with Small GND Pattern Area FIGS. 5A and 5B are views showing an IC mounted on a two-layered double-sided printed board or a single-layered single-sided printed board with a small GND pattern area and its connection state.

Figure 5A:
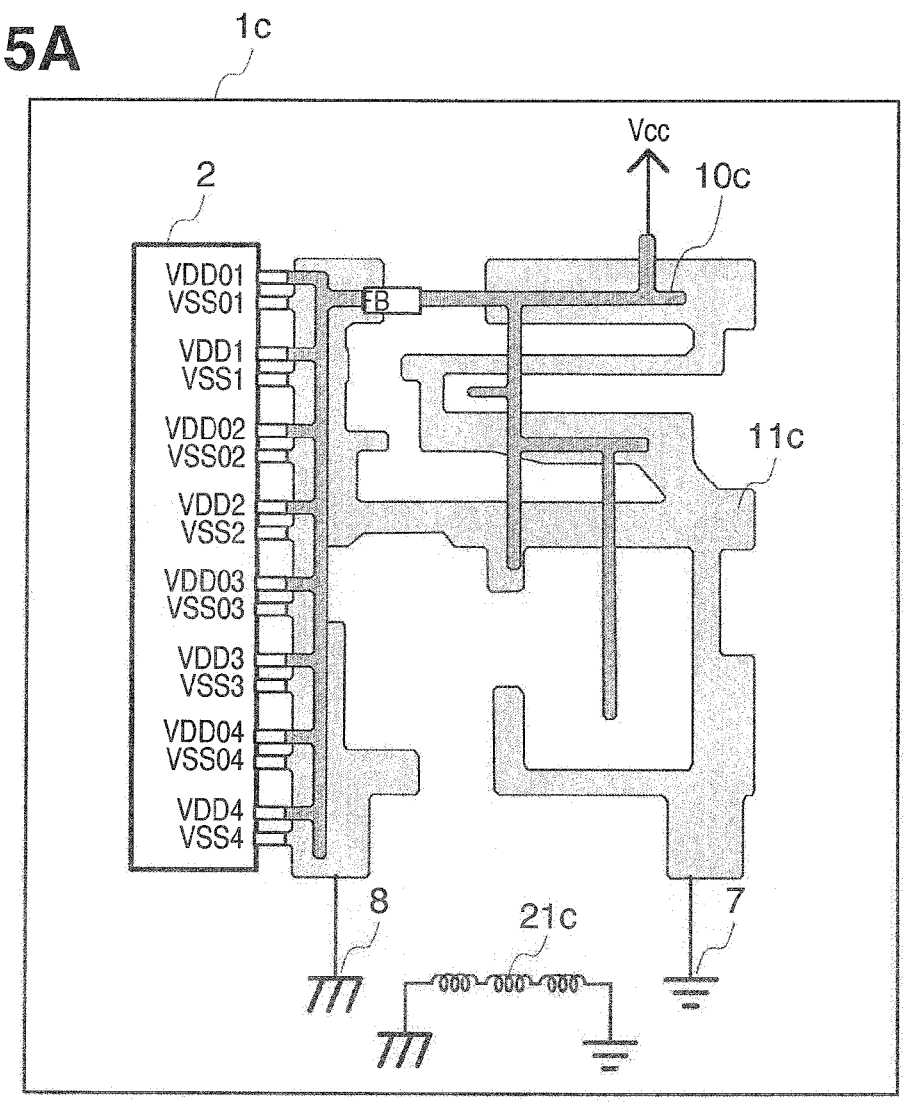
FIGS. 5A and 5B are views showing an IC mounted on a two-layered double-sided printed board or a single-layered single-sided printed board with a small GND pattern area and its connection state.
Figure 5B:
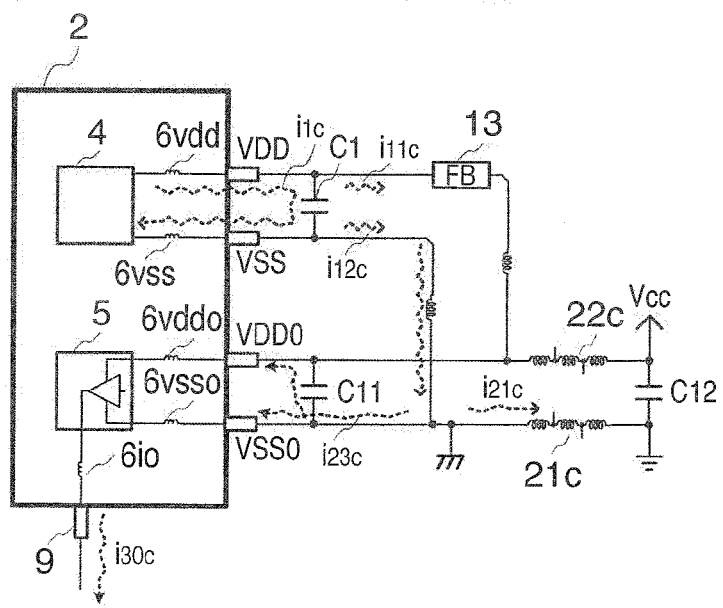

FIG. 5A schematically shows connection between the IC 2 and a printed board pattern. In this example, a power supply pattern 10c and GND pattern 11c generally connect the solder surface and component surface via many VIAs and jumper wires. These connection surfaces are not illustrated for the descriptive convenience. FIG. 5A shows the areas of the power supply pattern and GND pattern on a printed board 1c.

As shown in FIG. 5A, the power supply terminals VDDO1 to VDDO4 and VDD1 to VDD4 of the IC 2 connect to the power supply pattern 10c of the printed board 1c. On the other hand, the GND terminals VSSO1 to VSSO4 and VSS1 to VSS4 of the IC 2 connect to the GND pattern 11c serving as the signal GND 8 of the printed board 1c. The GND pattern 11c also connects to the frame GND 7. The GND terminals VSSO1 to VSSO4 and VSS1 to VSS4 of the IC 2 connect to the frame GND 7 via an inductance component 21c of the GND pattern 11c.

No bypass capacitor is illustrated for the sake of simplicity.

FIG. 5B schematically shows the noise propagation route on the single-layered single-sided printed board. The same symbols numerals as in FIG. 3B or 4B already described above denote the same constituent elements in FIG. 5B, and a description thereof will be omitted.

Upon high-speed switching of transistors in the internal core circuit 4, a high-frequency current i1c flows to the power supply terminal VDD and GND terminal VSS via the bonding wire 6vdd, bypass capacitor C1, bonding wire 6vss, and wiring lines in the internal core circuit 4. The high-frequency current i1c generates common-mode noise currents i11c and i12c. The high-frequency impedance of the ferrite bead 13 suppresses propagation of the noise current i11c to the power supply terminal VDDO and power supply Vcc. The noise current i12c changes to a normal-mode noise current i21c and flows to the frame GND 7 via the inductance component 21c.

The inductance 21c of the GND plane 11c has a relatively large value. Hence, a high-frequency potential variation is caused in the GND terminal VSSO by the high-frequency noise current i21c and inductance 21c and propagated to the power supply terminal VDDO via the bypass capacitor C11. The output signal terminal 9 of the I/O buffer 5 outputs the potentials of the GND terminal VSSO and power supply terminal VDDO of the I/O buffer 5 as high-level (H) and low-level (L) signals. The high-frequency potential variation is propagated to the signal output terminal via the parasitic capacitance between the signal output terminal and the power supply wiring line of the I/O buffer part and the parasitic capacitance between the signal output terminal and the GND wiring line of the I/O buffer part. That is, the high-frequency potential variation propagated to the power supply terminal VDDO and GND terminal VSSO is superimposed on all input/output signals of the I/O buffer 5.

When the IC 2 has two or more internal core GND terminals VSS and I/O buffer GND terminals VSSO, like an ASIC, the GND terminals are generally alternately arranged at the central portions and the ends of the sides. In this case, there are a plurality of internal core GND terminals VSS and I/O buffer GND terminals VSSO. If a solid pattern is formed as a wiring pattern connected to the internal core GND terminals VSS and I/O buffer GND terminals VSSO, the internal core GND terminals VSS and I/O buffer GND terminals VSSO are alternately connected.

When the total size of the printed board is taken into consideration, the internal core GND terminals VSS and I/O buffer GND terminals VSSO formed in the same IC are alternately arranged in almost the same location near the IC. As a result, the impedance between the internal core GND terminals VSS and I/O buffer GND terminals VSSO is lower than that from the IC to the frame GND of the printed board. For this reason, the internal core GND terminals VSS and I/O buffer GND terminals VSSO readily cause mutual propagation and interference of high-frequency noise.

The effect of the voltage drop caused by the noise current i21c and inductance 21c goes beyond generating a high-frequency potential variation and propagating it to the GND terminal VSSO and the power supply terminal VDDO via the bypass capacitor C11. The high-frequency potential variation is also propagated to the power supply voltage Vcc and the signal GND 8 as a whole. That is, the high-frequency noise variation is propagated to all circuit parts connected to the power supply voltage Vcc in the printed board 1c so as to change the entire printed board to a noise source.

If a number of cables connect to the printed board, most cables radiate noise, and a measure against this is harder to take. Taking a measure against noise requires a high cost. Additionally, in this arrangement, the part serving as a stable power supply pattern or GND pattern in a high-frequency band does not extend all over the printed board. For this reason, even when a bypass capacitor capable of low-impedance connection in the high-frequency band is added to the GND wiring part of the printed board, the potential of the connected GND wiring part itself varies due to the high-frequency noise. The measure against noise therefore has little effect. It is not easy to take an effective measure.

Embodiments of a printed board which suppresses radiant noise from an IC will be described next on the basis of the above-described arrangements and principles.

First Embodiment

As a characteristic feature, a printed wiring board according to the first embodiment suppresses radiant noise generated from the internal core circuit serving as a noise source in an IC by using a ferrite bead.

FIGS. 6A and 6B are views showing connection between an IC and a printed wiring board which suppresses radiant noise from the IC. The same reference numerals and symbols as in FIGS. 1A to 5B described above denote the same constituent elements and signals in FIGS. 6A and 6B, and a description thereof will be omitted.

FIG. 6A schematically shows connection between an IC 2 and a printed board pattern. In this example, a power supply pattern 10d and GND pattern 11d generally connect the patterns on the solder surface and component surface via many VIAs, lead jumpers, and chip jumpers. These connection surfaces are not illustrated for the descriptive convenience. FIG. 6A shows the areas of the power supply pattern and GND pattern on a printed board 1d.

As shown in FIG. 6A, internal core GND terminals VSS1 to VSS4 of the IC 2 connect to the GND pattern 11d on the printed board 1d not directly but via a ferrite bead 14. On the other hand, I/O buffer GND terminals VSSO1 to VSSO4 of the IC 2 connect directly to the GND pattern 11d. That is, the GND terminals VSS1 to VSS4 of the IC 2 are isolated from the GND terminals VSSO1 to VSSO4 via the ferrite bead 14 in a high-frequency band. The GND terminals VSSO1 to VSSO4 connect to a signal GND 8.

No bypass capacitor is illustrated for the sake of simplicity.

FIG. 6B schematically shows the noise propagation route on the printed board. The same reference symbols as in FIGS. 3B, 4B, and 5B already described above denote the same constituent elements in FIG. 6B, and a description thereof will be omitted.

As shown in FIG. 6B, in this embodiment, a power supply Vcc supplies a power supply voltage to a power supply terminal VDD via a ferrite bead 13.

Upon high-speed switching of transistors in an internal core circuit 4, a high-frequency current i1d flows to the power supply terminal VDD and a GND terminal VSS via bonding wires 6vdd and 6vss, a bypass capacitor C1, and the inductance of wiring lines in the internal core circuit 4. The high-frequency current i1d generates common-mode noise currents i11d and i12d. An inductance 21d of the GND plane 11d has a relatively large value. Hence, when a high-frequency current flows to the signal GND of the printed board 1d, the potential between the components becomes unstable.

However, according to this embodiment, the high-frequency impedance of the ferrite bead 13 suppresses propagation of the noise current i11d to a power supply terminal VDDO and the power supply voltage Vcc. On the other hand, the high-frequency impedance of the ferrite bead 14 suppresses propagation of the noise current i12d to a GND terminal VSSO and the signal GND 8.

It is therefore possible to confine, in the internal core circuit 4, the high-frequency noise generated by the switching operation of the internal core circuit 4 without propagation to the printed board 1d.

In other words, it is possible to confine the high-frequency current flowing due to the switching operation of the internal core circuit 4 in only a current closed loop formed by the internal core circuit 4 and bypass capacitor C1 without propagation to the printed board 1d.

Generally, when a GND potential is isolated from the other GND potentials, an operation error may occur between the circuit corresponding to the isolated GND potential part and the remaining circuits. That is, insertion of an inductance element to the GND terminal may cause an operation error. In the printed board according to this embodiment, the GND terminal VSS of the internal core circuit 4 connects to the GND pattern on the printed board via an inductance element in a high-frequency band with a high impedance.

However, since the GND terminal VSSO of an I/O buffer 5 with input/output signals connected to other circuits directly connects to the GND pattern on the printed board, it is fundamentally possible to eliminate the fear of the above-described operation error.

In this embodiment, the bypass capacitor C1 is adequately connected, as will be described below. This avoids the problem of an operation error even at the joint between the internal core circuit 4 connecting an inductance element to the GND terminal and the I/O buffer 5 not connecting an inductance element to the GND terminal. As a result, it is possible to confine, in the internal core circuit 4, the high-frequency noise generated by it.

In the printed wiring board according to this embodiment which suppresses radiant noise of the IC, the bypass capacitor C1 connects between the internal core power supply terminal VDD and the internal core GND terminal VSS. The ferrite bead 14 connects between the signal GND 8 and the GND terminal VSS.

Confinement of the high-frequency current as noise will be described next.

Figure 7A:
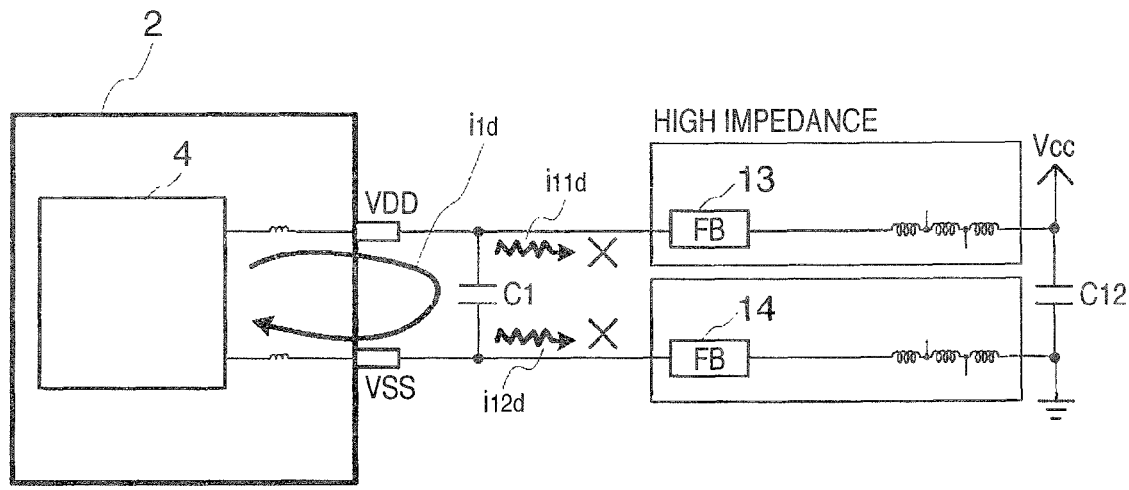
FIGS. 7A and 7B are views schematically showing high-frequency current confinement according to the first embodiment of the present invention.
Figure 7B:
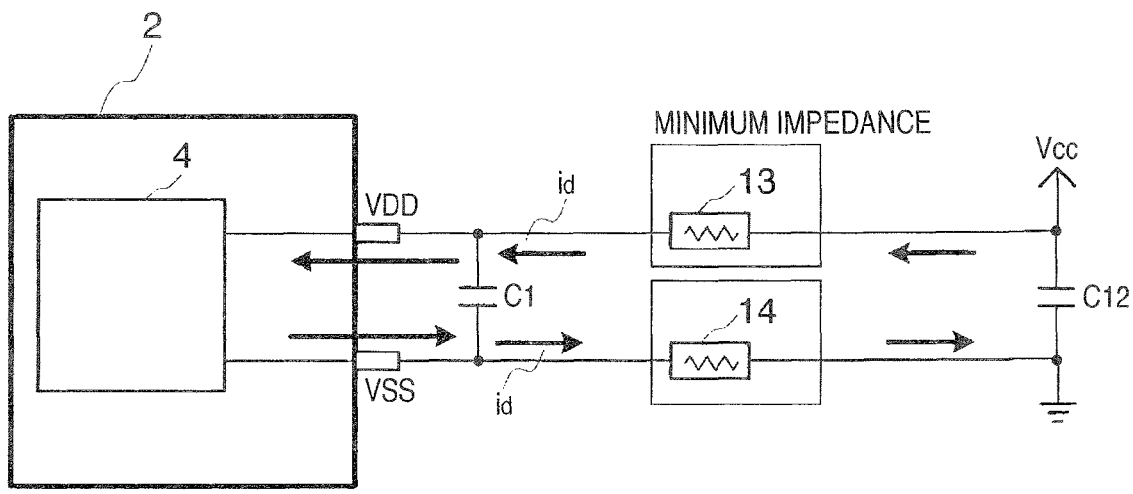

FIGS. 7A and 7B are views schematically showing high-frequency current confinement according to this embodiment.

As shown in FIG. 7A, the instantaneous carrying current i1$d$ necessary for the high-speed switching operation of the internal core circuit 4 is supplied from the bypass capacitor C1 by repeating charge and discharge. On the other hand, the power consumed by the internal core circuit 4 is supplied from the power supply voltage Vcc via the ferrite beads 13 and 14, as shown in FIG. 7B.

For example, a ferrite bead having an impedance of 100Ω at 100 MHz and a DC resistance of about 0.1 to 0.2Ω can sufficiently confine the noise source. A ferrite bead corresponding to a frequency band with a high radiant noise level is also selectable. If the average current consumed by the internal core circuit is, e.g., 100 mA, and the DC resistance of a ferrite bead is 0.2Ω, the voltage drop is 0.02 V. Hence, the internal core circuit 4 operates on a GND potential offset by 0.02 V as compared to the GND terminal potential of the I/O buffer 5. However, no problem is posed in the normal operation because the power supply voltage Vcc is about +1.8 to +3.3 V.

If the current consumption of the IC 2 is large, a ferrite bead with a lower DC resistance is selected. The capacitance value of the bypass capacitor C1 is determined in accordance with the switching frequency of the internal core circuit 4. Normally, a chip ceramic capacitor with a low impedance in the MHz band is used. The power supply terminal of the IC 2 often has an additional ferrite bead. Actually, the power supply voltage supplied to the IC 2 also slightly drops, like the GND potential, due to the voltage drop corresponding to the DC resistance of the ferrite bead. In the present invention, however, since the GND potential connected to the IC 2 is only slightly offset in accordance with the current consumption, no problem is posed in the normal operation.

In FIG. 6B, a diode D1 with a bidirectional structure is added as a measure against ESD between the GND terminals VSSO and VSS which are isolated in the high-frequency band. The diode is normally provided in the IC 2. If the IC 2 incorporates no diode, the diode D1 is necessary.

FIG. 8 is a view showing an example of pattern wiring when an IC 2 is mounted on a two-layered double-sided printed board.

As shown in FIG. 8, the IC 2 has two sets of internal core power supply terminals VDD and GND terminals VSS, and two sets of I/O buffer power supply terminals VDDO and GND terminals VSSO. The GND patterns 11$d$ of the printed board 1$d$ are formed on both layers of the printed board and connected via a number of VIAs. No VIAs are illustrated for the sake of simplicity.

On the lower surface of the printed board, a ferrite bead 45 isolates the internal core GND terminals VSS1 and VSS2 of the IC 2 from the pattern of the I/O buffer GND terminal VSSO. In addition, a ferrite bead 55 isolates the internal core power supply terminals VDD1 and VDD2 of the IC 2 from the pattern of the I/O buffer power supply terminal VDDO. The internal core GND terminals VSS1 and VSS2 of the IC 2 connect to the lower surface of the IC 2 via an island-shaped solid pattern with a relatively large area. On the upper surface of the printed board, bypass capacitors 50 and 51 connect between the internal core power supply and the internal core GND. On the other hand, bypass capacitors 40 and 41 connect between the I/O buffer power supply and the I/O buffer GND.

The island-shaped pattern having a relatively large area and connected to the internal core GND terminals VSS1 and VSS2 is arranged inside the terminal array of the IC 2. When the internal core GND terminals VSS1 and VSS2 connect to the inside of the terminal array of the IC via the pattern with a relatively large area, the wiring impedance between the terminals is formed low.

Generally, wiring lines in the IC 2 are formed as very thin lines. Hence, the longer internal wiring distance becomes, the higher the impedance is. For example, even in the GND wiring part of the I/O buffer connected in the IC 2, the impedance between opposite external terminals (between the terminals VSS1 and VSS2 and between the terminals VSSO1 and VSSO2 in FIG. 8) is high, and a DC resistance of several Ω is parasitic.

In the conventional arrangement wherein the internal core GND pattern and the I/O buffer GND pattern connect via a solid pattern by using wiring lines o the printed board outside the IC, the internal core circuit GND terminals VSS1 and VSS2 are connected via the solid pattern on the printed board. Hence, the connection has a low impedance.

In the printed board in which the GND pattern connected to the internal core GND terminal connects, via an inductance element, to the GND pattern connected to the I/O buffer GND terminal, the following problem is posed. The impedance between the internal core GND terminals VSS1 and VSS2 and that between the I/O buffer GND terminals VSSO1 and VSSO2 rise depending on the wiring method so that the immunity lowers.

To prevent this, the pattern wiring of the printed board shown in FIG. 8, the printed board area near the IC is used. More specifically, wiring is done such that the impedance between the internal core GND terminals VSS1 and VSS2 and that between the I/O buffer GND terminals VSSO1 and VSSO2 become low.

The impedance between the I/O buffer GND terminals VSSO1 and VSSO2 will be described here.

The signal current output from the I/O buffer (I/O port) flows a return current through the I/O buffer GND terminals. The number of the I/O buffer GND terminals is much smaller than the number of ports of the I/O buffer. That is, when the I/O buffer GND terminals (terminals VSSO1 and VSSO2 in FIG. 8) connect such that a low impedance is obtained, many return current paths are ensured.

The impedance between the internal core GND terminals VSS1 and VSS2 will be described next.

The common GND of the integrated circuit is also formed between the internal core GND terminals (terminals VSS1 and VSS2 in FIG. 8). For this reason, when the internal core GND terminals VSS1 and VSS2 connect such that a low impedance is obtained, many high-frequency current paths are ensured.

That is, since a high-frequency current flows to the pattern connected to the internal core GND terminals, the internal core GND terminals (terminals VSS1 and VSS2 in FIG. 8) connect such that a low impedance is obtained in a high-frequency band. This allows to further lower the noise level of the noise source. The internal core GND terminals (terminals VSS1 and VSS2 in FIG. 8) are formed on the lower portion of the IC package, i.e., on a portion surrounded by the external connection terminals of the IC.

Hence, the following effects can be obtained by not only isolating the GND pattern connected to the internal core GND terminals from the GND pattern connected to the I/O buffer GND terminals but also forming a GND pattern which connects the plurality of internal core GND terminals at a low impedance. That is, it is possible to further lower the noise level of the noise source. It is also possible to further improve the immunity by forming a GND pattern which connects the plurality of I/O buffer GND terminals at a low impedance.

The impedance between the I/O buffer GND terminals should be taken into consideration mainly for the immunity from the outside of the IC and also serve as the path of the return current from the outside of the IC. The impedance between the internal core GND terminals should be taken into consideration mainly for the high-frequency current generated from the inside of the IC. Hence, it is sometimes necessary to set a priority order for the impedance between the internal core GND terminals and that between the I/O buffer GND terminals because of the restrictions on the pattern wiring. In such a case, the wiring lines between the internal core GND terminals are preferably formed in a part surrounded by the external terminals of the IC.

A more detailed example of the wiring lines between the internal core GND terminals and those between the I/O buffer GND terminals described above will be described next with reference to FIGS. 15A and 15B.

Figure 15A:
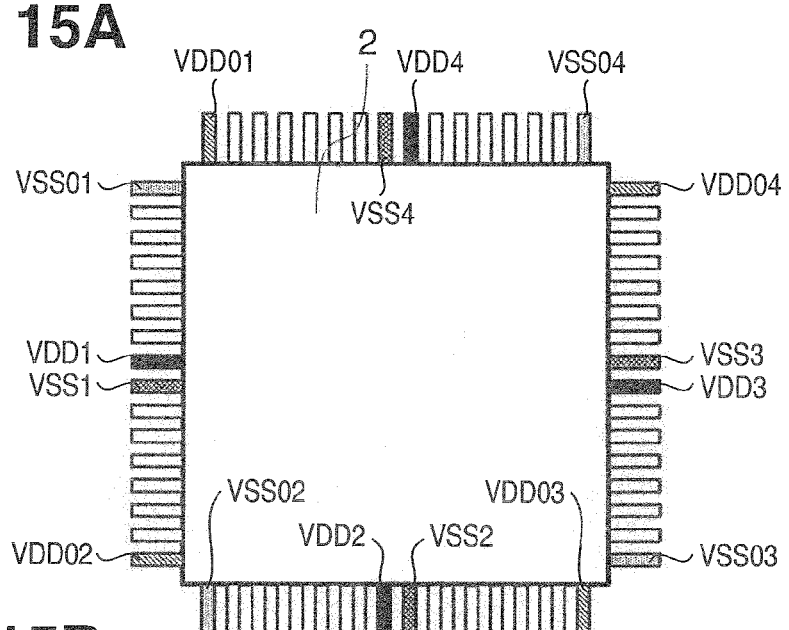
FIGS. 15A and 15B are views showing an example of pattern wiring when an IC 2 is mounted on a printed board.
Figure 15B:
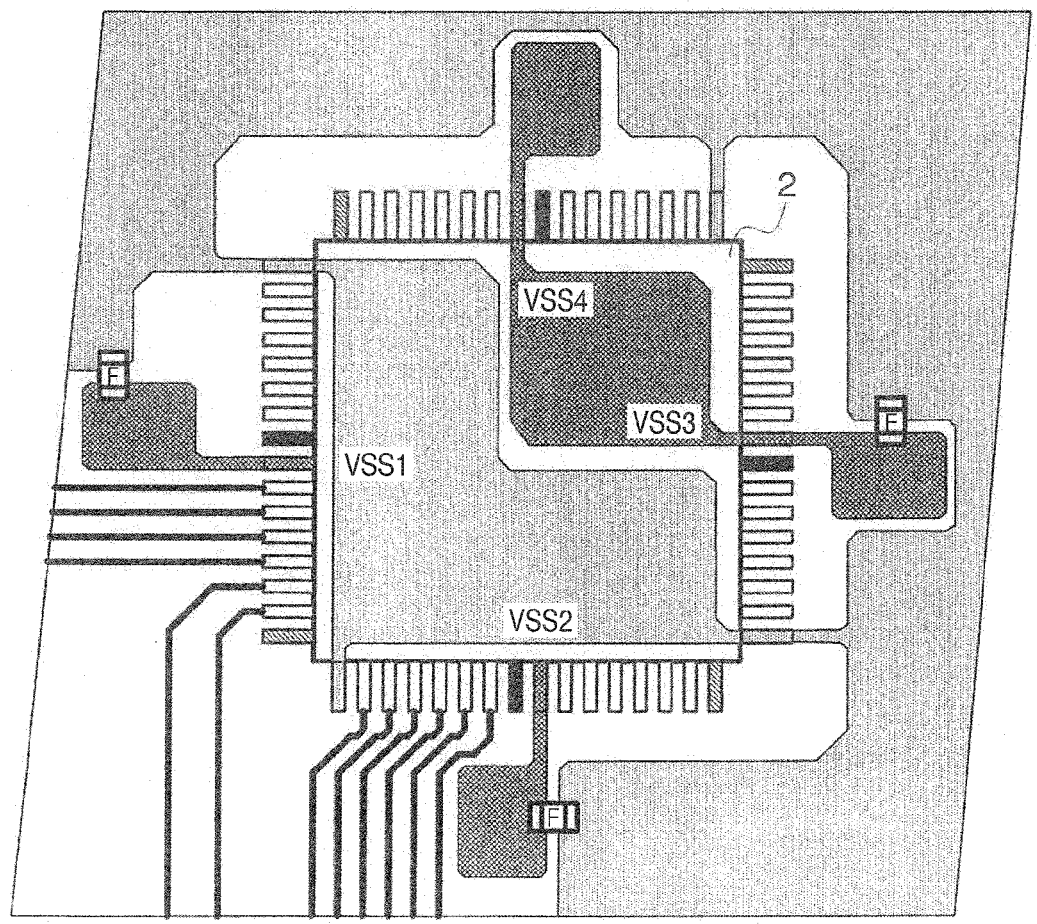

FIGS. 15A and 15B are views showing an example in which an ASIC having the four internal core GND terminals VSS1 to VSS4 and four I/O buffer GND terminals VSSO1 to VSSO4 shown in FIG. 1A is mounted on a printed board. In the arrangement example shown in FIGS. 15A and 15B, wiring lines connected to the internal core GND terminals are isolated from wiring lines connected to the I/O buffer GND terminals by a ferrite bead.

FIG. 15A shows the outer appearance of the mold package of the IC. FIG. 15B shows a state wherein several terminals of the ASIC connect to the printed board.

The GND terminal VSSO2 connects to the GND from the inside of the IC 2. The internal core GND terminals VSS3 and VSS4 connect to each other inside the IC 2. The internal core GND terminals are isolated from the I/O buffer GND terminals by an island-shaped pattern. It is therefore possible to sufficiently suppress high-frequency noise as compared to the conventional arrangement (the internal core GND pattern and I/O buffer GND pattern are connected via a solid pattern by using wiring lines on the printed board outside the IC).

However, the internal core GND terminals VSS1 and VSS2 are isolated from the island-shaped pattern connected to the internal core GND terminals VSS3 and VSS4. That is, to enhance the effect of lowering the noise level generated from the internal core circuit, the wiring is changed, as described with reference to FIG. 8. More specifically, the wiring between the internal core GND terminals (the terminals VSS1 and VSS2 in FIG. 8, and the terminals VSS1, VSS2, VSS3, and VSS4 in FIGS. 15A and 15B) is preferably changed such that the impedance becomes low. This allows to further lower the noise level of the noise source.

Especially in a single-layered printed board having only one copper foil layer, it is impossible to cross patterns in the part surrounded by the external connection terminals of the surface mounting type IC package, and the wiring as show in FIGS. 15A and 15B readily occurs. FIGS. 16A and 16B show an example in which the pattern wiring arrangement in FIGS. 15A and 15B is further improved.

FIGS. 16A and 16B show an example in which the wiring lines connected to the internal core GND terminals VSS1 to VSS4 are formed inside the IC package (part surrounded by the external connection terminals).

FIG. 16A shows the outer appearance of the mold package of the IC. FIG. 16B shows a state wherein several terminals of the ASIC connect to the printed board.

As shown in FIGS. 16A and 16B, forming wiring lines connected to the I/O buffer GND terminals mainly outside the IC package allows to further lower the noise level of the noise source.

As described above, according to this embodiment, in the printed board with an IC in which the power supply and GND terminals of the internal core are isolated inside from those of the I/O buffer, impedance isolation in a high-frequency band is done. To do this, an inductance element is added between the external GND terminals of the internal core and those of the I/O buffer. This isolation prevents the high-frequency potential variation generated in the internal core power supply and GND terminals from being propagated to the I/O buffer power supply and GND terminals of the IC and the whole printed board via the pattern on the printed board with the IC mounted.

As a result, according to this embodiment, an arrangement capable of suppressing radiation from a device having a printed board, cable, and metal case can be formed only by adding several ferrite beads.

Conventionally, forming a solid GND pattern having an area as large as possible on a printed board is a measure against radiant noise. According to this embodiment, however, it is possible to take a measure against radiant noise of the IC independently of the GND pattern area of the printed board. This makes it possible to reduce the area of the GND pattern that is conventionally used as a measure against radiant noise. Hence, the degree of freedom in designing a pattern on the printed board can be increased.

Additionally, it is possible to decrease the number of filter components which are added to the signal lines connected to the input and output ports of the IC and serve as a measure against radiant noise. It is also possible to decrease the number of shield members which are provided in a device having a printed wiring board with an IC and serve as a measure against radiant noise.

In the example described in the above embodiment, the ferrite beads 13 and 14, bypass capacitors C1 and C11, and ESD protection diode D1 are formed on the printed board. However, the present invention is not limited to this. For example, as shown in FIG. 9, the IC may incorporate an inductance 16 (equivalent to the ferrite bead 13), inductance 17 (equivalent to the ferrite bead 14), bypass capacitors C1 and C11, and ESD protection diode D1.

Figure 9:
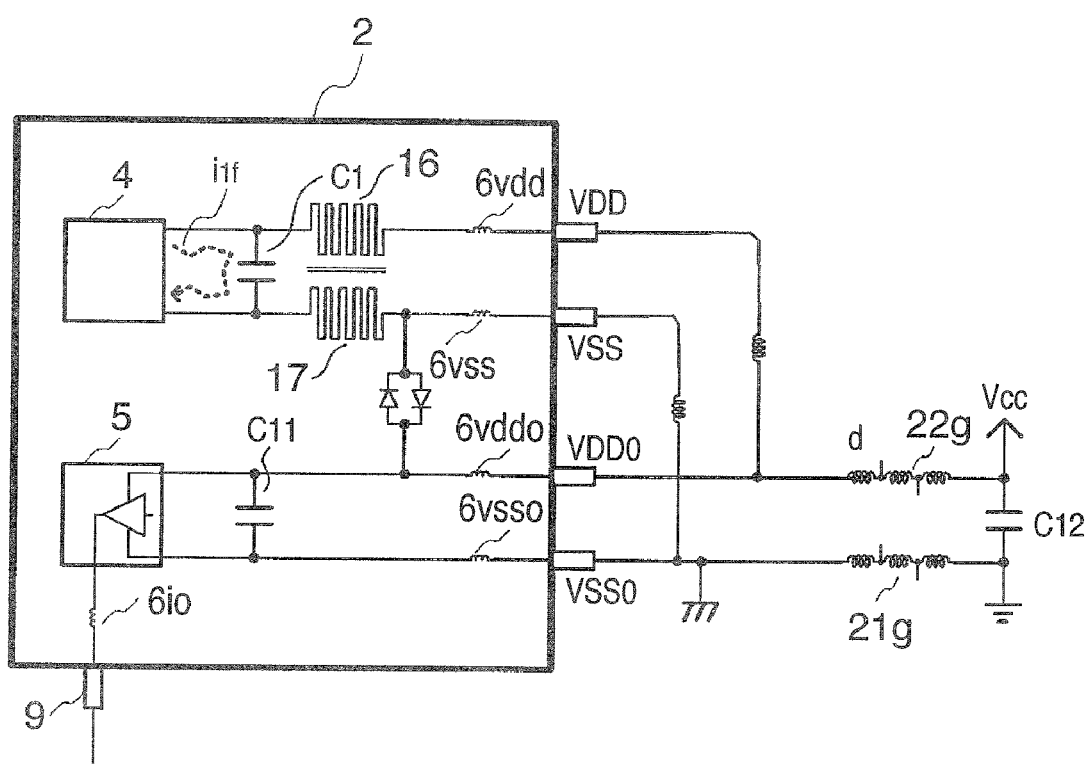
FIG. 9 is a view showing the internal arrangement of an IC incorporating constituent elements to suppress radiant noise.

As shown in FIG. 9, the inductances 16 and 17 are formed by inductance components that can be formed in a semiconductor chip. It is effective to, e.g., route a wiring pattern with a toggle pattern in the semiconductor chip to obtain a desired inductance component.

Second Embodiment

As a characteristic feature, a printed wiring board according to the second embodiment suppresses high-frequency noise generated from the internal core circuit serving as a noise source in an IC by using a common-mode choke. The IC to be described in this embodiment is an ASIC that operates a number of internal logic circuits by a predetermined synchronous clock.

FIGS. 10A and 10B are views showing connection between an IC and a printed wiring board which suppresses radiant noise from the IC. The same reference numerals and symbols as in FIGS. 1A to 6B described above denote the same constituent elements and signals in FIGS. 10A and 10B, and a description thereof will be omitted.

FIG. 10A schematically shows connection between an IC 2 and a printed board pattern. In this example, a power supply pattern 10e and GND pattern i1e generally connect the patterns on the solder surface and component surface via many VIAs, lead jumpers, and chip jumpers. These connection surfaces are not illustrated for the descriptive convenience.

FIG. 10A shows the areas of the power supply pattern and GND pattern on a printed board 1e.

As shown in FIG. 10A, internal core GND terminals VSS1 to VSS4 of the IC 2 connect to the GND pattern 11e on the printed board 1e not directly but via a common-mode choke 15. On the other hand, an internal core power supply terminal VDD connects such that a power is supplied from a power supply voltage Vcc via a ferrite bead 13 and the common-mode choke 15. That is, the common-mode current flowing from both an internal core GND terminal VSS and the power supply terminal VDD connects to a signal GND 8 of the printed board and the power supply voltage Vcc via the common-mode choke 15.

No bypass capacitor is illustrated for the sake of simplicity.

FIG. 10B schematically shows the noise propagation route on the printed board. The same reference symbols as in FIGS. 3B, 4B, 5B, and 6B already described above denote the same constituent elements in FIG. 10B, and a description thereof will be omitted.

Upon high-speed switching of transistors integrated in an internal core circuit 4, a high-frequency current i1e flows to the power supply terminal VDD and GND terminal VSS via bonding wires 6vdd and 6vss, a bypass capacitor C1, and the inductance of wiring lines in the internal core circuit 4. The high-frequency current i1e generates common-mode noise currents i11e and i12e. An inductance 21e of the GND plane 11e has a relatively large value. Hence, when a high-frequency current flows to the signal GND of the printed board 1e, the potential between the components becomes unstable.

However, the common-mode choke 15 suppresses common-mode propagation of the noise currents i11e and i12e to the power supply voltage Vcc and signal GND 8.

A power supply wiring pattern with a small pattern width and high impedance as compared to the GND pattern readily generates normal-mode noise. The high-frequency impedance of the ferrite bead 13 suppresses propagation of the generated normal-mode noise component to a power supply terminal VDDO and the power supply voltage Vcc.

It is therefore possible to confine, in the internal core circuit 4, the high-frequency noise generated by the switching operation of the internal core circuit 4 without propagation to the printed board 1e. In other words, it is possible to confine the high-frequency current flowing due to the switching operation of the internal core circuit 4 in a current closed loop formed by the internal core circuit 4 and bypass capacitor C1 without propagation to the printed board 1e.

Confinement of the high-frequency current as noise will be described next.

Figure 11A:
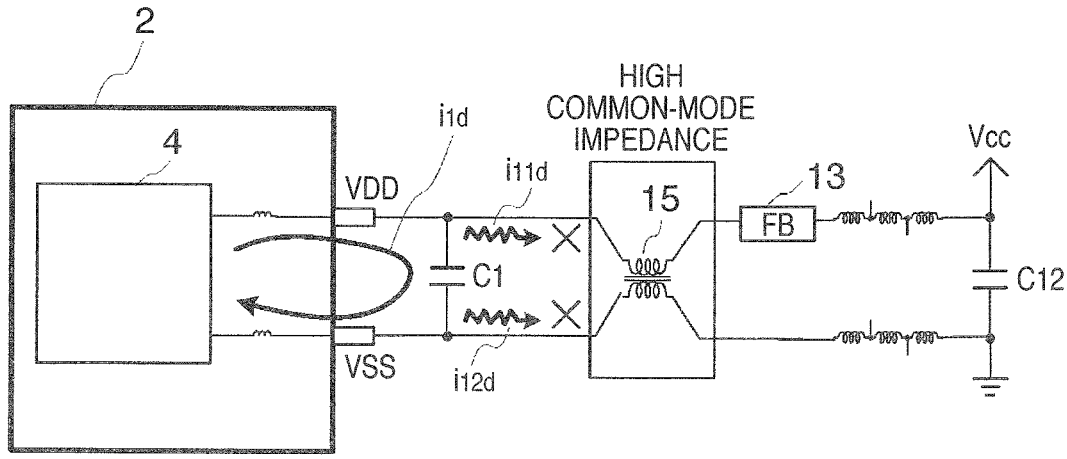
FIGS. 11A to 11C are views schematically showing high-frequency current confinement according to the second embodiment of the present invention.
Figure 11B:
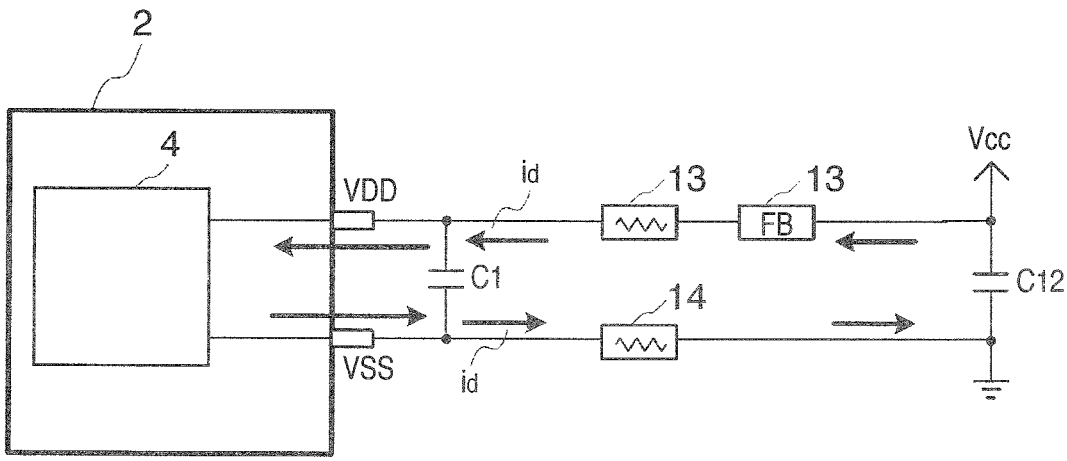

FIGS. 11A and 11B are views schematically showing high-frequency current confinement according to this embodiment.

As shown in FIG. 1A, the instantaneous carrying current i1d necessary for the high-speed switching operation of the internal core circuit 4 is supplied from the bypass capacitor C1 by repeating charge and discharge. On the other hand, the impedance for the current supplied from the power supply voltage Vcc in the normal mode is hardly generated because of the common-mode choke, as shown in FIG. 11B. That is, the presence/absence of the common-mode choke is irrelevant to the current supplied from the power supply voltage Vcc in the normal mode. Exactly, the common-mode choke also has a low DC resistance (resistors 13 and 14). For this reason, a potential drop corresponding to the low DC resistance occurs, though its level does not pose any problem.

Figure 11C:
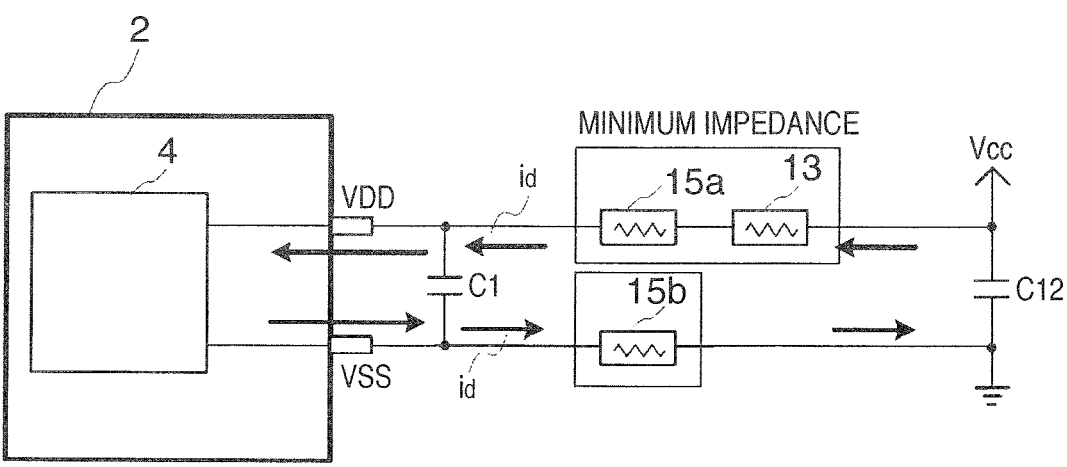

FIG. 11C shows an equivalent circuit for a DC current. The power consumed by the internal core circuit 4 is supplied from the power supply voltage Vcc via the ferrite bead 13 and common-mode choke 15. The potential drop corresponding to the DC resistance of the ferrite bead 13 and common-mode choke 15 poses no problem in the normal operation because the power supply voltage Vcc is about +1.8 to +3.3 V, as described in the first embodiment.

As described in the first embodiment, it is possible to further lower the noise level of the noise source by not only isolating the GND pattern connected to the internal core GND terminals from the GND pattern connected to the I/O buffer GND terminals but also forming a GND pattern which connects the plurality of internal core GND terminals (VSS1 to VSS4 in FIG. 10A) at a low impedance. It is also possible to further improve the immunity by forming a GND pattern which connects the plurality of I/O buffer GND terminals (VSSO1 to VSSO4 in FIG. 10A) at a low impedance.

As described above, according to this embodiment, in the printed board with an IC in which the power supply and GND terminals of the internal core are isolated inside from those of the I/O buffer, impedance isolation in a high-frequency band is done. This isolation is done for the current flowing from the internal core power supply and GND terminals in the common mode by adding a common-mode choke to the internal core power supply and GND terminals. This prevents the high-frequency potential variation generated in the internal core power supply and GND terminals from being propagated to the I/O buffer power supply and GND terminals of the IC and the whole printed board via the pattern on the printed board with the IC mounted.

As a result, according to the above-described embodiment, an arrangement capable of suppressing radiation from a device having a printed board, cable, and metal case can be formed only by adding one common-mode choke.

Even this embodiment can provide the same effect as described in the first embodiment.

Third Embodiment

As a characteristic feature, a printed wiring board according to the third embodiment suppresses high-frequency noise generated from the internal core circuit serving as a noise source in an IC by using wiring isolation of a GND pattern. The IC to be described in this embodiment is an ASIC as in the second embodiment.

A printed wiring board according to this embodiment has an arrangement obtained by replacing the ferrite bead 14 described in the first embodiment with pattern wiring. The arrangement with pattern wiring is applied to a printed board such as a four-layered printed board having a sufficient large board area. More specifically, an island pattern of power supply terminals VDD1 to VDD4 shown in FIGS. 6A and 6B is isolated from the power supply pattern of power supply terminals VDDO1 to VDDO4. In addition, an island pattern of GND terminals VSS1 to VSS4 is isolated from the GND pattern of GND terminals VSSO1 to VSSO4. The inductance values of the joints to the power supply terminals VDD1 to VDD4 and the GND terminals VSS1 to VSS4 can be adjusted by intervening at least one VIA. An inductance can also be formed by forming, e.g., a zigzag pattern.

As a result, the inductance component by pattern wiring suppresses propagation of a high-frequency potential variation generated in an internal core circuit 4 to a power supply terminal VDDO and power supply voltage Vcc, and a GND terminal VSSO and signal GND 8.

It is therefore possible to confine, in the internal core circuit 4, the high-frequency noise generated by the switching operation of the internal core circuit 4 without propagation to a printed board 1.

Hence, it is possible to suppress propagation of high-frequency noise generated by the switching operation of the internal core circuit 4 to a printed board If and almost confine the noise in the internal core circuit 4. In other words, it is possible to suppress propagation of a high-frequency current flowing due to the switching operation of the internal core circuit 4 to the printed board If and flow the main high-frequency current into a current closed loop formed by the internal core circuit 4 and bypass capacitor C1.

Figure 12A:
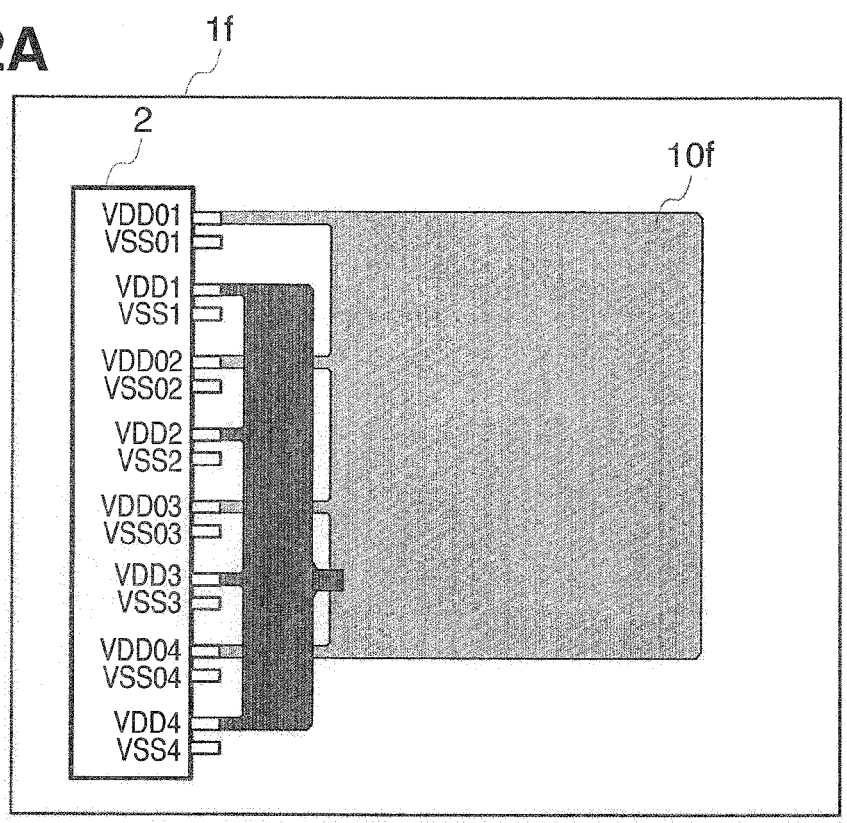
FIGS. 12A and 12B are views showing examples of a four-layered printed board with pattern wiring isolation according to the third embodiment of the present invention.
Figure 12B:
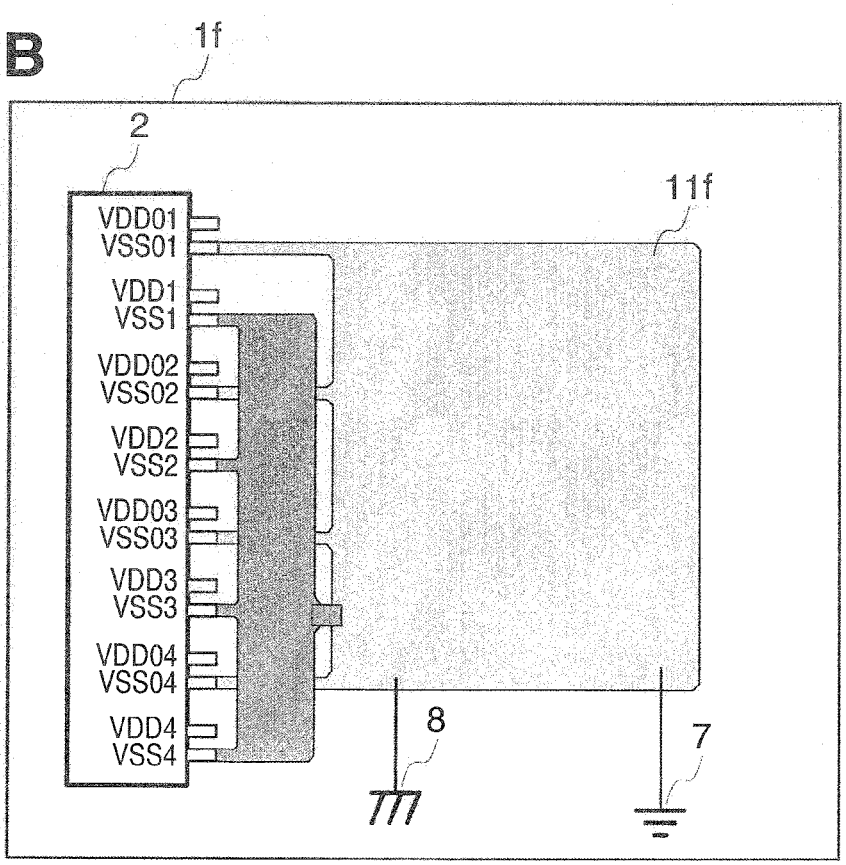

FIGS. 12A and 12B are views showing examples of a four-layered printed board with pattern wiring isolation according to this embodiment. FIG. 12A shows an example of a power supply wiring pattern, and FIG. 12B shows an example of a GND wiring pattern. Referring to FIGS. 12A and 12B, the internal core power supply terminals VDD1 to VDD4 and internal core GND terminals VSS1 to VSS4 of the IC 2 are formed as island-shaped patterns in the periphery of the IC 2 and isolated from a power supply plane 10f and a GND plane 11f, respectively.

As described in the first embodiment, it is possible to further lower the noise level of the noise source by not only isolating the GND pattern connected to the internal core GND terminals from the GND pattern connected to the I/O buffer GND terminals but also forming a GND pattern which connects the plurality of internal core GND terminals (VSS1 to VSS4 in FIG. 12B) at a low impedance. It is also possible to further improve the immunity by forming a GND pattern which connects the plurality of I/O buffer GND terminals (VSSO1 to VSSO4 in FIG. 12B) at a low impedance.

As described above, high-frequency noise generated by the high-speed switching operation of the internal core circuit isolates the pattern connected to the power supply terminal VDD and the pattern connected to the GND terminal VSS from the remaining power supply and GND patterns. This suppresses noise propagation from the power supply terminal VDD and GND terminal VSS of the internal core circuit.

Additionally, it is possible to decrease the number of filter circuits which are added to signals input/output to/from the IC and serve as a measure against radiant noise. It is also possible to decrease the number of shield members which are provided in a device having a printed wiring board with an IC and serve as a measure against radiant noise.

As described above, according to this embodiment, in the printed board with an IC in which the power supply and GND terminals of the internal core are isolated inside from those of the I/O buffer, impedance isolation in a high-frequency band is done. To do this, an island-shaped pattern is formed as pattern wiring connected to the external GND terminals of the internal core separately from the remaining GND pattern wiring connected to the external GND terminals of the I/O buffer. This prevents the high-frequency potential variation generated in the internal core power supply and GND terminals from being propagated to the I/O buffer power supply and GND terminals of the IC and the whole printed board via the pattern on the printed board with the IC mounted.

As a result, according to the above-described embodiment, an arrangement capable of suppressing radiation from a device having a printed board, cable, and metal case can be formed without increasing the cost.

Even this embodiment can provide the same effect as described in the first and second embodiments.

Fourth Embodiment

A printed wiring board according to the fourth embodiment has the following characteristic feature. As for pattern wiring to the internal core power supply terminals and internal core GND terminals, dedicated wiring lines from the power supply part of the printed board are formed such that the power supply and GND wiring lines become parallel. A mutual inductance by wiring is also formed. Hence, this embodiment will be described letting Vcc2 be the power supply voltage for the internal core and Vcc1 be the power supply voltage for the I/O buffer.

Figure 13A:
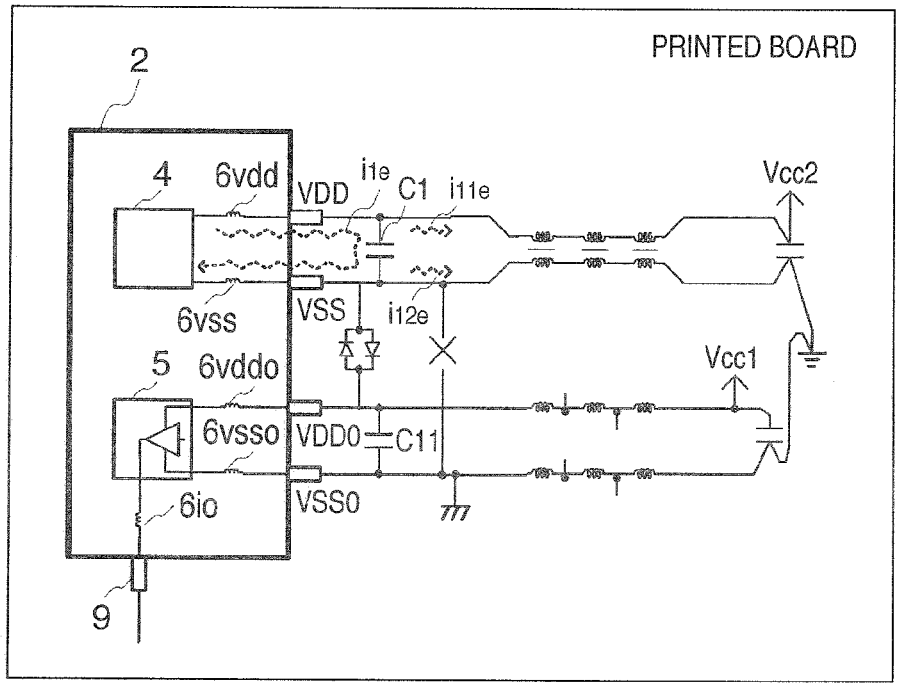
FIGS. 13A and 13B are views showing a noise propagation route on a printed board according to the fourth embodiment of the present invention.
Figure 13B:
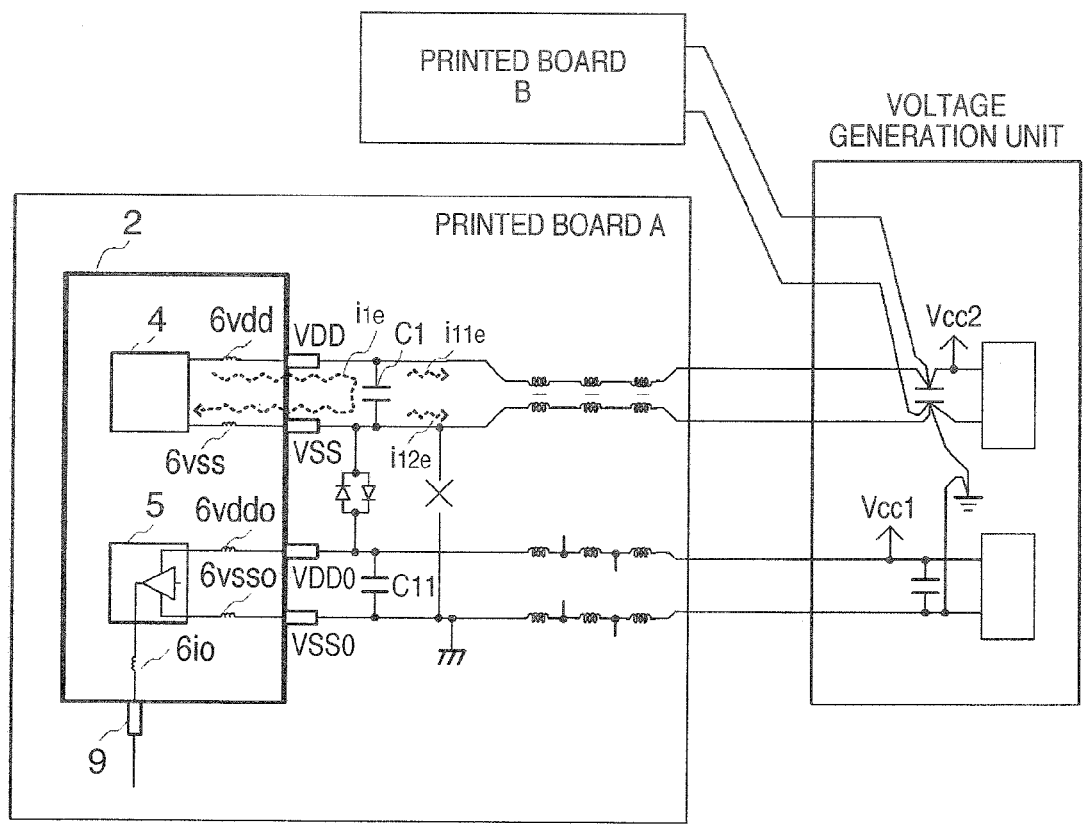

FIGS. 13A and 13B are views showing a noise propagation route on a printed board according to this embodiment.

As shown in FIG. 13A, in one printed board, the internal core GND terminal and I/O buffer GND terminal are connected by single-point ground near the frame GND of the printed board.

FIG. 13B shows a wiring example of a device including two printed boards A and B, in which power supply voltages to the ICs are supplied from separate units. As for pattern wiring to the power supply and GND terminals of an internal core 4 in the printed board A, dedicated power supply pattern and GND pattern from the voltage generation unit are formed such that the pair of internal core power supply and GND wiring lines become parallel, like the example shown in FIG. 13A.

As shown in FIG. 13B, the internal core GND terminal and I/O buffer GND terminal are connected by single-point ground in the generation unit of the power supply voltage Vcc2 of the voltage generation unit. The frame GND is arranged near it. The power supply wiring line and GND connection of the power supply voltage Vcc2 supplied to the other printed board B are also connected by single-point ground.

Figure 14A:
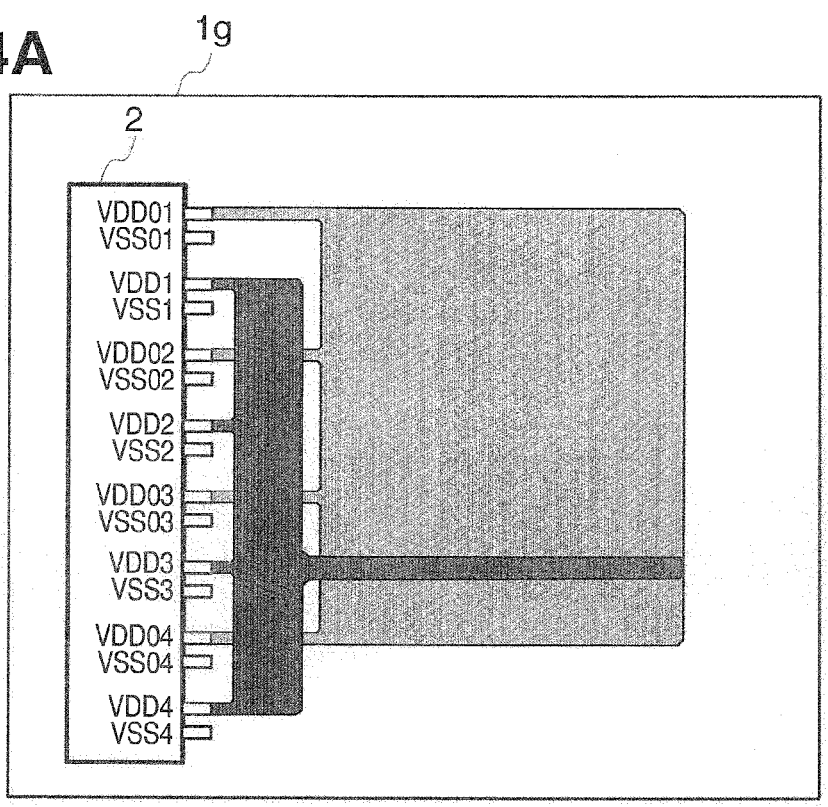
FIGS. 14A and 14B are views showing examples of a four-layered printed board with pattern wiring isolation according to the fourth embodiment of the present invention.
Figure 14B:
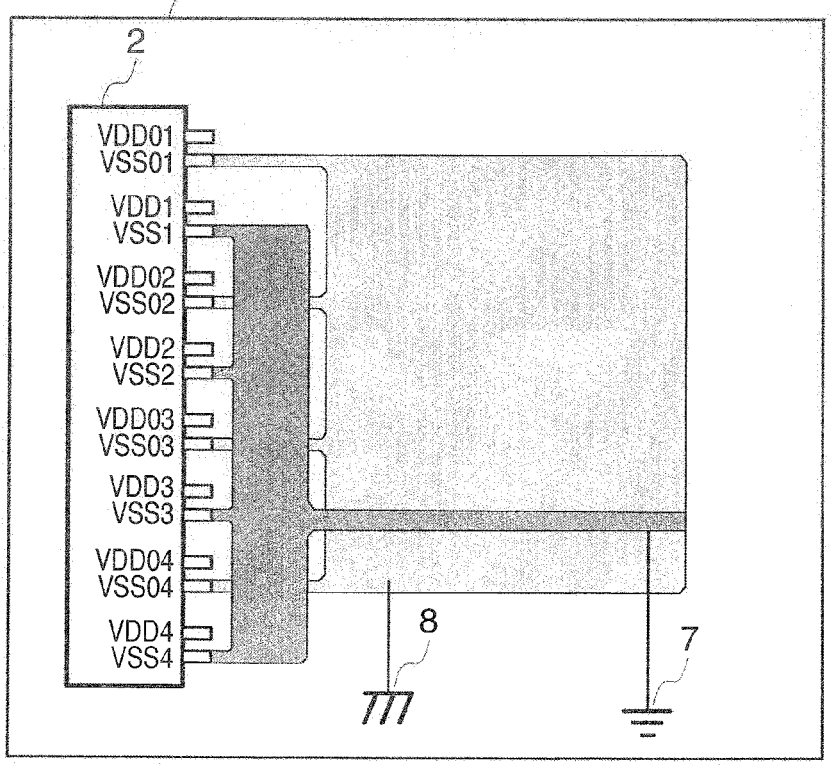

FIGS. 14A and 14B are views showing examples of a four-layered printed board with pattern wiring isolation.

FIG. 14A shows a wiring example of a power supply plane layer, and FIG. 14B shows a wiring example of a GND plane layer. Referring to FIGS. 14A and 14B, internal core power supply terminals VDD1 to VDD4 and internal core GND terminals VSS1 to VSS4 of an IC 2 are formed as island-shaped patterns in the periphery of the IC in parallel to the vicinity of the frame GND of the printed board and then connected by single-point ground.

The pattern wiring lines of the internal core power supply and GND terminals are formed in parallel until they are connected by single-point ground. Hence, common-mode noise generated in the internal core circuit 4 stably flows to the frame GND while being suppressed from changing to normal-mode noise. Hence, high-frequency noise propagation to an I/O buffer power supply terminal VDDO and GND terminal VSSO is suppressed.

According to this embodiment, common-mode noise generated in the internal core circuit 4 stably flows to the frame GND of the voltage generation unit while being suppressed from changing to normal-mode noise. Hence, high-frequency noise propagation to the I/O buffer power supply terminal VDDO and GND terminal VSSO of the IC is suppressed. In addition, high-frequency noise propagation to other printed boards is also suppressed.

As described in the first embodiment, it is possible to further lower the noise level of the noise source by not only isolating the GND pattern connected to the internal core GND terminals from the GND pattern connected to the I/O buffer GND terminals but also forming a GND pattern which connects the plurality of internal core GND terminals (VSS1 to VSS4 in FIG. 14B) at a low impedance. It is also possible to further improve the immunity by forming a GND pattern which connects the plurality of I/O buffer GND terminals (VSSO1 to VSSO4 in FIG. 14B) at a low impedance.

In the above-described first to fourth embodiments, the measure to prevent high-frequency noise generated in the internal core circuit from being propagated to the remaining circuits has been described by using an ASIC as an example. However, the present invention is not limited to this. The present invention is easily applicable to an IC such as a DSP.

The present invention is applicable to an IC with any arrangement if it has at least two pairs of power supply and GND terminals, and one pair of power supply and GND terminals are isolated inside from the other pair of power supply and GND terminals. Especially, the present invention is easily applicable as a means for isolation in a high-frequency band to cope with general noise interference.

The arrangement of the printed wiring board of the above-described embodiments can suppress high-frequency noise interference of a specific circuit part. This arrangement is reversely easily applicable to suppress interference from an external noise source for some circuits of the IC.

In the above-described embodiments, both the voltage of the internal core power supply and the voltage of the I/O buffer power supply have been described as Vcc. However, the present invention is not limited to this. For example, even when the power supply voltage for the internal core is +2.5 V, and the power supply voltage for the I/O buffer is +3.3 V, the present invention is easily applicable because it has a characteristic feature in the wiring on the GND terminal side.

The above-described printed wiring board is preferably applied to an electronic circuit of, e.g., an image forming apparatus.

According to the present invention, it is possible to suppress a high-frequency potential variation generated by the operation of the first circuit of an IC from being propagated to the power supply and GND terminals of the second circuit of the IC and the whole printed board by a simple structure.

This makes it possible to suppress unwanted radiation from a device having not only a printed board but also, e.g., a cable and metal case by an inexpensive structure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-053802 filed Feb. 28, 2006, which is hereby incorporated by reference herein in its entirety.

What is claimed is:

1. A printed board including a GND pattern and a power supply pattern, the printed board comprising:
   an IC that includes an I/O buffer circuit and a core circuit,
      the core circuit including a first power supply terminal and a first GND terminal, and
      the I/O buffer circuit including a second power supply terminal and a second GND terminal,
      wherein a first pair of terminals, including the first power supply terminal and the first GND terminal, and a second pair of terminals, including the second power supply terminal and the second GND terminal, are isolated;
   a first capacitor connected to a connecting path between the first power supply terminal and a power supply pattern and a connecting path between the first GND terminal and the GND pattern;
   a second capacitor connected to a connecting path between the second power supply terminal and the power supply pattern and a connecting path between the second GND terminal and the GND pattern; and
   a first suppressing unit that suppresses a high-frequency potential variation generated by an operation of the core circuit,
   wherein the second power supply terminal is connected to the power supply pattern, and the second GND terminal is connected to the GND pattern, and
   wherein the first suppressing unit is connected to a connecting path between the power supply pattern and a connecting part of the first power supply terminal and the first capacitor, in the connecting path between the first power supply terminal and the power supply pattern.

2. The board according to claim 1,
   wherein the IC includes a plurality of first pair terminals,
   wherein the GND pattern of the printed board has a short-distance pattern with a portion arranged inside a terminal array of the IC, and
   wherein first GND terminals of the plurality of first pair terminals are connected to the short-distance pattern.

3. The board according to claim 1, wherein the first suppressing unit includes a ferrite bead.

4. The board according to claim 1, wherein an impedance of the first suppressing unit is low with respect to a DC current and high with respect to a high-frequency current.

5. The board according to claim 1, wherein a predetermined power supply voltage is supplied to the first power supply terminal and the second power supply terminal.

6. The board according to claim 1, further comprising a capacitor connected between the first power supply terminal and the first GND terminal.

7. The board according to claim 6, further comprising:
   a capacitor provided in a route that guides a wiring line from the first power supply terminal to a wiring line from the second power supply terminal and the power supply pattern, and
   a capacitor connected between the second power supply terminal and the second GND terminal.

8. The board according to claim 7, further comprising a second suppressing unit that suppresses a high frequency potential variation generated by an operation of the core circuit, wherein the second suppressing unit includes a ferrite bead.

9. A control circuit that controls radiation noise generated from an IC that includes a core circuit and an I/O buffer circuit, in which the core circuit includes a first power supply terminal and a first GND terminal, and in which the I/O buffer circuit includes a second power supply terminal and a second GND terminal, the control circuit comprising:
   a first suppressing element that suppresses a high-frequency potential variation generated by an operation of the core circuit;
   a first capacitor connected to a connecting path between the first power supply terminal and a power supply and a connecting path between the first GND terminal and a GND pattern; and
   a second capacitor connected to a connecting path between the second power supply terminal and the power supply and a connecting path between the second GND terminal and the GND pattern,
   wherein the second power supply terminal is connected to the power supply, and the second GND terminal is connected to the GND pattern, and
   wherein the first suppressing unit is connected to a connecting path between the power supply and a connecting part of the first power supply terminal and the first capacitor, in the connecting path between the first power supply terminal and the power supply.

10. The circuit according to claim 9, wherein the first suppressing element includes a ferrite bead.

11. The circuit according to claim 9, further comprising a third capacitor connected between the power supply and the GND pattern.

12. The board according to claim 1, further comprising a second suppressing unit that suppresses a high-frequency potential variation generated by an operation of the core circuit, wherein the second suppressing unit is connected to a connecting path between the GND pattern and a connecting part of the first GND terminal and the first capacitor, in the connecting path between the first GND terminal and the GND pattern.

13. The board according to claim 12, wherein the second suppressing unit includes a ferrite bead.

14. The circuit according to claim 9, further comprising a second suppressing element that suppresses suppress a high-frequency potential variation generated by an operation of the core circuit, wherein the second suppressing unit is connected to a connecting path between the GND and a connecting part of the first GND terminal and the first capacitor, in the connecting path between the first GND terminal and the GND pattern.

15. The circuit according to claim 14, wherein the second suppressing element includes a ferrite bead.

* * * * *